United States Patent
Goward et al.

(10) Patent No.: US 10,998,297 B1
(45) Date of Patent: May 4, 2021

(54) NANO-POROUS METAL INTERCONNECT FOR LIGHT SOURCES

(71) Applicant: Facebook Technologies, LLC, Menlo Park, CA (US)

(72) Inventors: John Michael Goward, Redmond, WA (US); Stephen John Holmes, Redmond, WA (US); Maxwell Parsons, Berkeley, CA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/397,343

(22) Filed: Apr. 29, 2019

Related U.S. Application Data

(60) Provisional application No. 62/671,626, filed on May 15, 2018.

(51) Int. Cl.
| | |
|---|---|
| H01L 29/18 | (2006.01) |
| H01L 33/00 | (2010.01) |
| H01L 25/075 | (2006.01) |
| H01L 33/62 | (2010.01) |
| H01L 33/58 | (2010.01) |

(52) U.S. Cl.
CPC ...... *H01L 25/0753* (2013.01); *H01L 33/0045* (2013.01); *H01L 33/58* (2013.01); *H01L 33/62* (2013.01); *H01L 2933/0033* (2013.01); *H01L 2933/0058* (2013.01); *H01L 2933/0066* (2013.01)

(58) Field of Classification Search
CPC ..... H01L 25/0753; H01L 33/62; H01L 33/58; H01L 33/0045; H01L 2933/0033; H01L 2933/0066; H01L 2933/0058
See application file for complete search history.

(56) References Cited

U.S. PATENT DOCUMENTS

| | | | | |
|---|---|---|---|---|
| 2006/0006778 A1* | 1/2006 | Lee | ...................... | H01L 51/5275 313/113 |
| 2010/0270673 A1* | 10/2010 | Oppermann | ............ | H01L 24/83 257/739 |
| 2013/0245416 A1* | 9/2013 | Yarmush | .................. | H01B 7/30 600/396 |
| 2013/0329440 A1* | 12/2013 | Tsutsumi | .............. | F21S 41/143 362/465 |

(Continued)

*Primary Examiner* — Ismail A Muse
(74) *Attorney, Agent, or Firm* — Fenwick & West LLP

(57) ABSTRACT

A light-emitting assembly that includes multiple light-emitting devices electrically coupled to a substrate via nano-porous metal blocks. The light-emitting assembly may be used as a source array of a near-eye display device. The light-emitting devices may be superluminescent diodes and the nano-porous metal blocks may include nano-porous gold. The nano-porous metal blocks allow thermal and electrical conduction between the light-emitting devices and the substrate. Nano-porous gold allows bonding at a lower temperature than solder and is compressible. Different pressure can be applied to different nano-porous metal blocks to align the optical heights of different light-emitting devices relative to the substrate. After forming nano-porous metal blocks on a substrate, the light-emitting devices are pressed onto the metal blocks to secure and align the light-emitting devices. The alignment process may be carried in an active optical alignment process when the light-emitting devices are powered and emit light.

20 Claims, 14 Drawing Sheets

(56) References Cited

U.S. PATENT DOCUMENTS

| | | | | |
|---|---|---|---|---|
| 2014/0061709 A1* | 3/2014 | Suh | ............... | H01L 33/0095 |
| | | | | 257/98 |
| 2014/0078757 A1* | 3/2014 | Chen | ............... | H01L 25/0753 |
| | | | | 362/382 |
| 2018/0366450 A1* | 12/2018 | Gardner | ............... | H01L 33/0093 |
| 2019/0081025 A1* | 3/2019 | Chang | ............... | H01L 33/62 |
| 2019/0148321 A1* | 5/2019 | Chaji | ............... | H01L 33/62 |
| | | | | 438/57 |

* cited by examiner

NANO-POROUS METAL INTERCONNECT FOR LIGHT SOURCES

CROSS REFERENCE TO RELATED APPLICATION

This application claims the benefit of U.S. Provisional Application No. 62/671,626, filed May 15, 2018, which is incorporated by reference in its entirety.

BACKGROUND

This disclosure relates generally to making light-emitting assemblies, and in particular, to connecting light-emitting devices to a substrate via a nano-porous metal block.

Near-eye, light-field displays project images directly into a user's eye, encompassing both near-eye displays and electronic viewfinders. The image light is originated from arrays of light-emitting devices arranged on a substrate. Near-eye displays may be a scanning type display device. In other words, before reaching a user's eyes, the image light originating from the arrays of light-emitting devices often passes through and/or is reflected by one or more optical components such as lenses, mirrors, gratings, waveguides, and the like. The image light is scanned by one or more of those optical components that project the image to different parts of a screen. Since optical components are used in rendering the images, the optical output locations of the light-emitting devices need to be properly aligned to ensure a high quality of the output image.

SUMMARY

Embodiments described herein generally relate to light-emitting assemblies that include nano-porous metal blocks as interconnects that electrically and mechanically couple light-emitting devices to a substrate. The nano-porous metal blocks are compressible to allow an easy alignment of optical heights among different light-emitting devices relative to the substrate. The nano-porous metal blocks may also be conductive so that the nano-porous metal block can serve as pathways for thermal and electrical exchanges between the light-emitting devices and the substrate.

In one embodiment, a light-emitting assembly includes a substrate having a surface. The light-emitting assembly also includes a first light-emitting device that includes a first mounting surface conductively coupled to the surface of the substrate by a first nano-porous metal block. An optical output location of the first light-emitting device is separated by a distance from the surface of the substrate. The light-emitting assembly further includes a second light-emitting device that includes a second mounting surface conductively coupled to the surface of the substrate by a second nano-porous metal block. The optical heights of the light-emitting devices relative to the surface of the substrate can be aligned to the same level.

The figures depict embodiments of the present disclosure for purposes of illustration only.

DETAILED DESCRIPTION

Embodiments relate to display devices that includes a light source having one or more light-emitting assemblies. A light-emitting assembly may include a plurality of light-emitting devices mounted on a substrate via nano-porous metal blocks. A nano-porous metal block may serve as the electrical and thermal pathway between a light-emitting device and the substrate. The light-emitting devices on the subtract may each have a slightly different optical output location due to various reasons such as the differences in materials, manufacturing variances within tolerance, and the layers in the active regions having slightly different physical and material properties. As a result, the heights of the optical output locations may be different for various light-emitting devices. The optical output locations may be aligned by applying different degrees of compression to the nano-porous metal blocks to adjust the optical output height of each light-emitting device.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world)

content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Near-Eye Display

Figure 1:
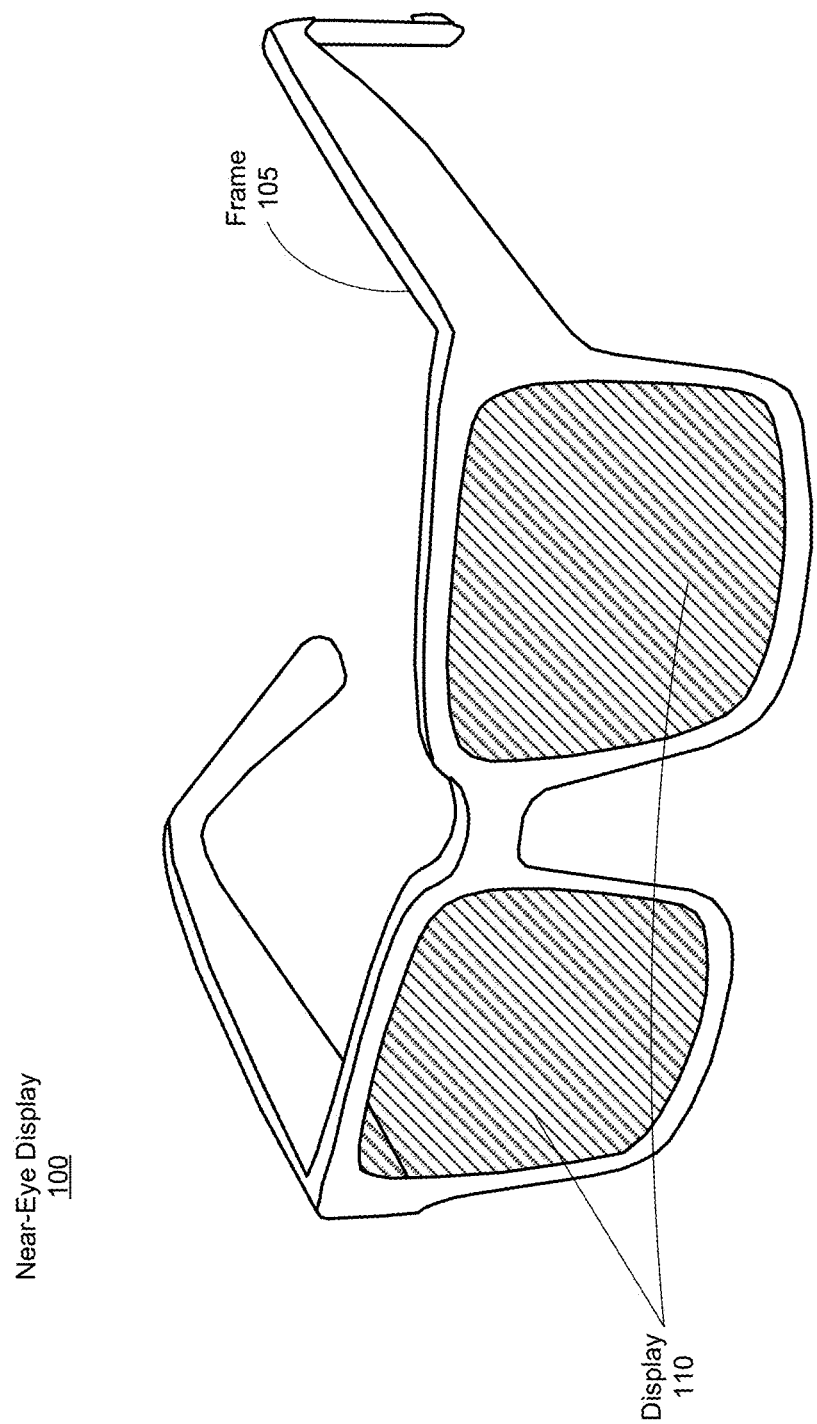
FIG. 1 is a perspective view of a near-eye-display (NED), in accordance with an embodiment.

FIG. 1 is a diagram of a near-eye display (NED) 100, in accordance with an embodiment. The NED 100 presents media to a user. Examples of media presented by the NED 100 include one or more images, video, audio, or some combination thereof. In some embodiments, audio is presented via an external device (e.g., speakers and/or headphones) that receives audio information from the NED 100, a console (not shown), or both, and presents audio data based on the audio information. The NED 100 may operate as a VR NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., images, video, sound, etc.).

The NED 100 shown in FIG. 1 includes a frame 105 and a display 110. The frame 105 includes one or more optical elements which together display media to users. The display 110 is configured for users to see the content presented by the NED 100. As discussed below in conjunction with FIG. 2, the display 110 includes at least a source assembly to generate an image light to present media to an eye of the user. The source assembly includes, e.g., a light source, an optics system, or some combination thereof.

FIG. 1 is only an example of a VR system. However, in alternate embodiments, FIG. 1 may also be referred to as a Head-Mounted-Display (HMD).

Figure 2:
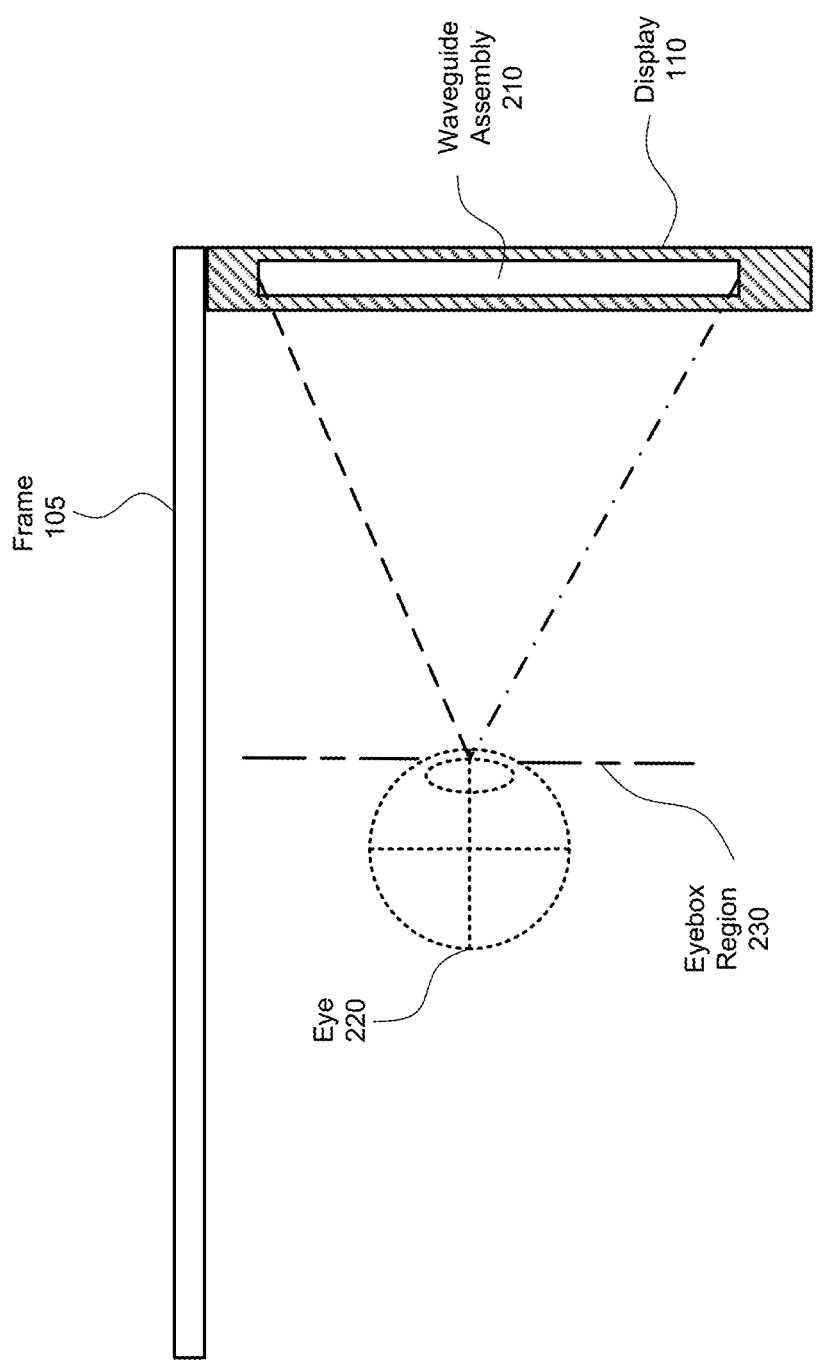
FIG. 2 is a cross-sectional view of an eyewear of the NED illustrated in FIG. 1, in accordance with an embodiment.

FIG. 2 is a cross-sectional view of the NED 100 illustrated in FIG. 1, in accordance with an embodiment. The cross section illustrates at least one waveguide assembly 210. An exit pupil is a location where the eye 220 is positioned in an eyebox region 230 when the user wears the NED 100. In some embodiments, the frame 105 may represent a frame of eye-wear glasses. For purposes of illustration, FIG. 2 shows the cross section associated with a single eye 220 and a single waveguide assembly 210, but in alternative embodiments not shown, another waveguide assembly which is separate from the waveguide assembly 210 shown in FIG. 2, provides image light to another eye 220 of the user.

The waveguide assembly 210, as illustrated below in FIG. 2, directs the image light to the eye 220 through the exit pupil. The waveguide assembly 210 may be composed of one or more materials (e.g., plastic, glass, etc.) with one or more refractive indices that effectively minimize the weight and widen a field of view (hereinafter abbreviated as 'FOV') of the NED 100. The waveguide assembly 210 may include one or more waveguides. In alternate configurations, the NED 100 includes one or more optical elements between the waveguide assembly 210 and the eye 220. The optical elements may act (e.g., correct aberrations in image light emitted from the waveguide assembly 210) to magnify image light emitted from the waveguide assembly 210, some other optical adjustment of image light emitted from the waveguide assembly 210, or some combination thereof. The example for optical elements may include an aperture, a Fresnel lens, a convex lens, a concave lens, a filter, or any other suitable optical element that affects image light. In one embodiment, the waveguide assembly 210 may produce and direct many pupil replications to the eyebox region 230, in a manner that will be discussed in further detail below in association with FIG. 5B.

Figure 3A:
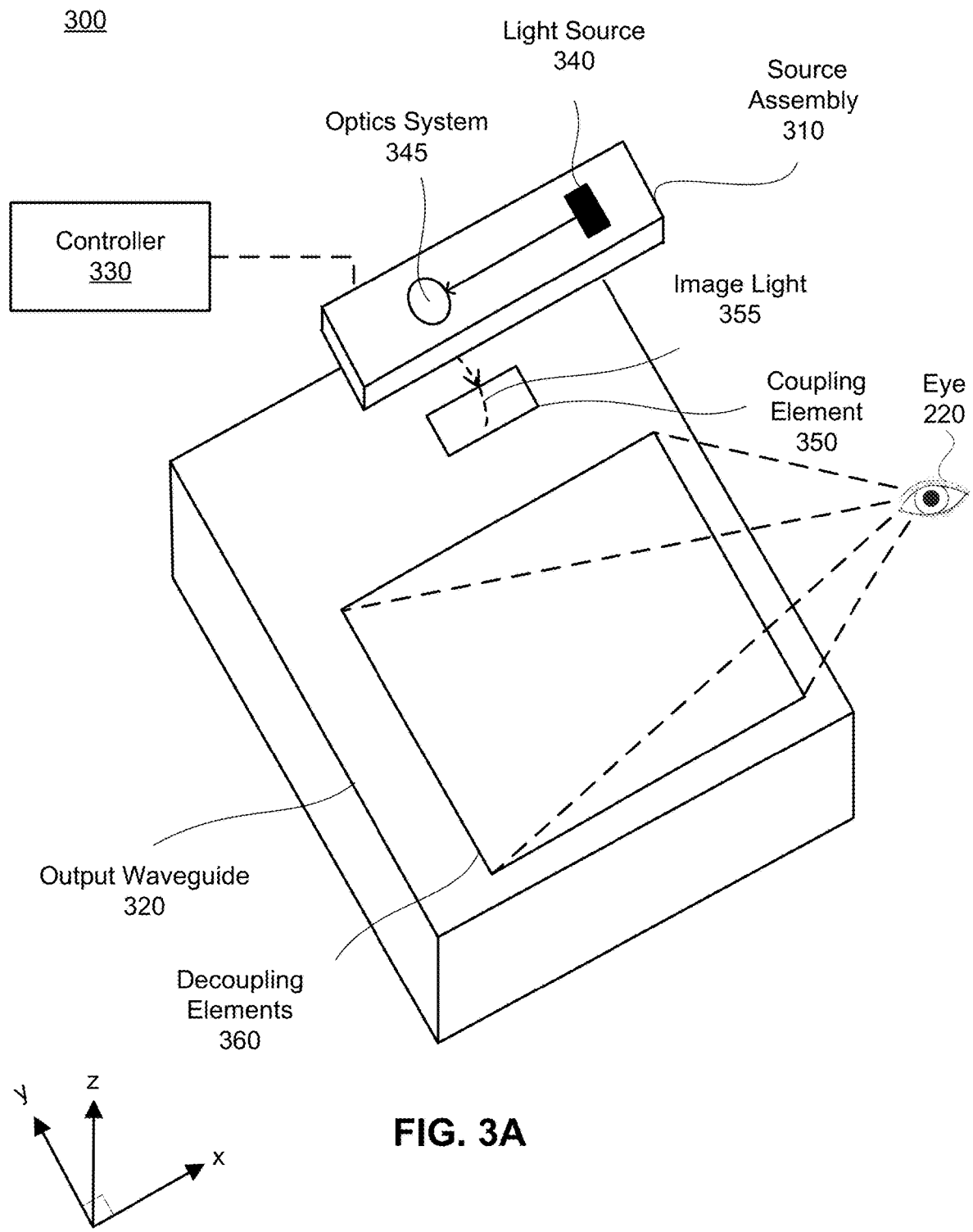
FIG. 3A is a perspective view of a display device, in accordance with an embodiment.

FIG. 3A illustrates a perspective view of a display device 300, in accordance with an embodiment. In some embodiments, the display device 300 is a component (e.g., the waveguide assembly 210 or part of the waveguide assembly 210) of the NED 100. In alternative embodiments, the display device 300 is part of some other NEDs, or another system that directs display image light to a particular location. Depending on embodiments and implementations, the display device 300 may also be referred to as a waveguide display and/or a scanning display. However, in other embodiment, the display device 300 does not include a scanning mirror. For example, the display device 300 can include matrices of light emitters that project light on an image field through a waveguide but without a scanning mirror. In another embodiment, the image emitted by the two-dimensional matrix of light emitters may be magnified by an optical assembly (e.g., lens) before the light arrives a waveguide or a screen.

For a particular embodiment that uses a waveguide and an optical system, the display device 300 may include a source assembly 310, an output waveguide 320, and a controller 330. The display device 300 may provide images for both eyes or for a single eye. For purposes of illustration, FIG. 3A shows the display device 300 associated with a single eye 220. Another display device (not shown), separated (or partially separated) from the display device 300, provides image light to another eye of the user. In a partially separated system, one or more components may be shared between display devices for each eye.

The source assembly 310 generates image light 355. The source assembly 310 includes a light source 340 and an optics system 345. The light source 340 is an optical component that generates image light using a plurality of light emitters. The light emitters may be arranged in one or more matrices. Each matrix may be a light-emitting assembly. Each light emitter may emit monochromatic light. The light source 340 generates image light including, but not restricted to, Red image light, Blue image light, Green image light, infra-red image light, etc. While RGB is often discussed in this disclosure, embodiments described herein are not limited to using red, blue and green as primary colors. Other colors are also possible to be used as the primary colors of the display device. Also, a display device in accordance with an embodiment may use more than three primary colors.

The optics system 345 performs a set of optical processes, including, but not restricted to, focusing, combining, conditioning, and scanning processes on the image light generated by the light source 340. In some embodiments, the optics system 345 includes a combining assembly, a light conditioning assembly, and a scanning mirror assembly, as described below in detail in conjunction with FIG. 3B. The source assembly 310 generates and outputs an image light 355 to a coupling element 350 of the output waveguide 320.

The output waveguide 320 is an optical waveguide that outputs image light to an eye 220 of a user. The output waveguide 320 receives the image light 355 at one or more coupling elements 350, and guides the received input image light to one or more decoupling elements 360. The coupling element 350 may be, e.g., a diffraction grating, a holographic grating, some other element that couples the image light 355 into the output waveguide 320, or some combination thereof. For example, in embodiments where the coupling element 350 is diffraction grating, the pitch of the diffraction grating is chosen such that total internal reflection occurs, and the image light 355 propagates internally toward the decoupling element 360. The pitch of the diffraction grating may be in the range of 300 nm to 600 nm.

The decoupling element 360 decouples the total internally reflected image light from the output waveguide 320. The decoupling element 360 may be, e.g., a diffraction grating, a holographic grating, some other element that decouples image light out of the output waveguide 320, or some combination thereof. For example, in embodiments where the decoupling element 360 is a diffraction grating, the pitch of the diffraction grating is chosen to cause incident image light to exit the output waveguide 320. An orientation and position of the image light exiting from the output waveguide 320 are controlled by changing an orientation and position of the image light 355 entering the coupling element 350. The pitch of the diffraction grating may be in the range of 300 nm to 600 nm.

The output waveguide 320 may be composed of one or more materials that facilitate total internal reflection of the image light 355. The output waveguide 320 may be composed of e.g., silicon, plastic, glass, or polymers, or some combination thereof. The output waveguide 320 has a relatively small form factor. For example, the output waveguide 320 may be approximately 50 mm wide along X-dimension, 30 mm long along Y-dimension and 0.5-1 mm thick along Z-dimension.

The controller 330 controls the image rendering operations of the source assembly 310. The controller 330 determines instructions for the source assembly 310 based at least on the one or more display instructions. Display instructions are instructions to render one or more images. In some embodiments, display instructions may simply be an image file (e.g., bitmap). The display instructions may be received from, e.g., a console of a VR system (not shown here). Scanning instructions are instructions used by the source assembly 310 to generate image light 355. The scanning instructions may include, e.g., a type of a source of the image light (e.g., monochromatic, polychromatic), a scanning rate, an orientation of a scanning apparatus, one or more illumination parameters, or some combination thereof. The controller 330 includes a combination of hardware, software, and/or firmware not shown here so as not to obscure other aspects of the disclosure.

Figure 3B:
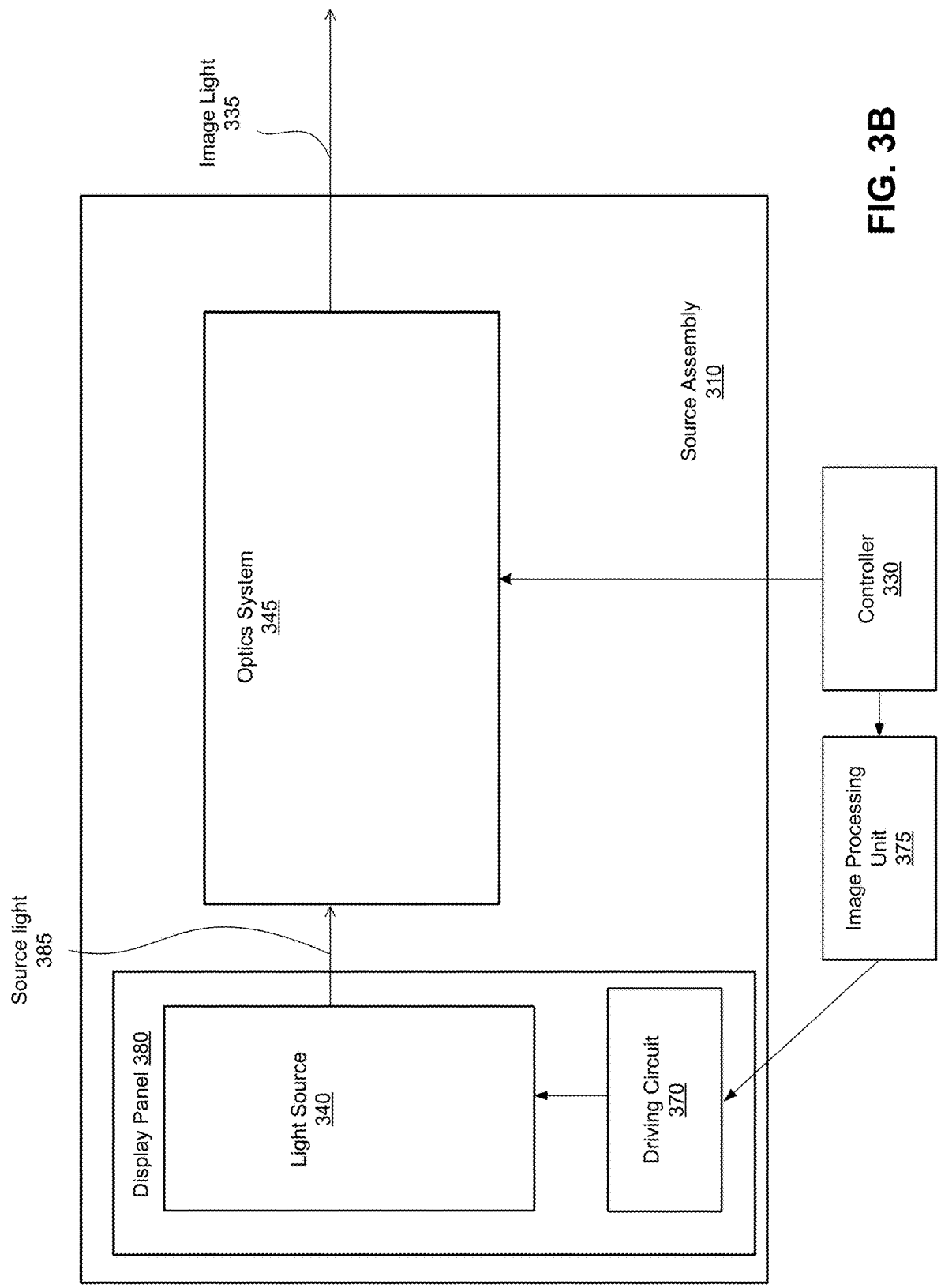
FIG. 3B is a block diagram of a display device, in accordance with an embodiment.

FIG. 3B is a block diagram illustrating an example source assembly 310, in accordance with an embodiment. The source assembly 310 includes the light source 340 that emits light that is processed optically by the optics system 345 to generate image light 335 that will be projected on an image field (not shown). The light source 340 is driven by the driving circuit 370 based on the data sent from a controller 330 or an image processing unit 375. In one embodiment, the driving circuit 370 is the circuit panel that connects to and mechanically holds various light emitters of the light source 340. The driving circuit 370 and the light source 340 combined may sometimes be referred to as a display panel 380 or an LED panel (if some forms of LEDs are used as the light emitters).

The light source 340 may generate a spatially coherent or a partially spatially coherent image light. The light source 340 may include multiple light emitters. The light emitters can be vertical cavity surface emitting laser (VCSEL) devices, light emitting diodes (LEDs), microLEDs, tunable lasers, and/or some other light-emitting devices. In one embodiment, the light source 340 includes a matrix of light emitters. In another embodiment, the light source 340 includes multiple sets of light emitters with each set grouped by color and arranged in a matrix form. The light source 340 emits light in a visible band (e.g., from about 390 nm to 700 nm). The light source 340 emits light in accordance with one or more illumination parameters that are set by the controller 330 and potentially adjusted by image processing unit 375 and driving circuit 370. An illumination parameter is an instruction used by the light source 340 to generate light. An illumination parameter may include, e.g., source wavelength, pulse rate, pulse amplitude, beam type (continuous or pulsed), other parameter(s) that affect the emitted light, or some combination thereof. The light source 340 emits source light 385. In some embodiments, the source light 385 includes multiple beams of Red light, Green light, and Blue light, or some combination thereof.

The optics system 345 may include one or more optical components that optically adjust and potentially re-direct the light from the light source 340. One form of example adjustment of light may include conditioning the light. Conditioning the light from the light source 340 may include, e.g., expanding, collimating, correcting for one or more optical errors (e.g., field curvature, chromatic aberration, etc.), some other adjustment of the light, or some combination thereof. The optical components of the optics system 345 may include, e.g., lenses, mirrors, apertures, gratings, or some combination thereof. Light emitted from the optics system 345 is referred to as an image light 355.

The optics system 345 may redirect image light via its one or more reflective and/or refractive portions so that the image light 355 is projected at a particular orientation toward the output waveguide 320 (shown in FIG. 3A). Where the image light is redirected toward is based on specific orientations of the one or more reflective and/or refractive portions. In some embodiments, the optics system 345 includes a single scanning mirror that scans in at least two dimensions. In other embodiments, the optics system 345 may include a plurality of scanning mirrors that each scan in orthogonal directions to each other. The optics system 345 may perform a raster scan (horizontally, or vertically), a biresonant scan, or some combination thereof. In some embodiments, the optics system 345 may perform a controlled vibration along the horizontal and/or vertical directions with a specific frequency of oscillation to scan along two dimensions and generate a two-dimensional projected line image of the media presented to user's eyes. In other embodiments, the optics system 345 may also include a lens that serves similar or same function as one or more scanning mirror.

In some embodiments, the optics system 345 includes a galvanometer mirror. For example, the galvanometer mirror may represent any electromechanical instrument that indicates that it has sensed an electric current by deflecting a beam of image light with one or more mirrors. The galvanometer mirror may scan in at least one orthogonal dimension to generate the image light 355. The image light 355 from the galvanometer mirror represents a two-dimensional line image of the media presented to the user's eyes.

In some embodiments, the source assembly 310 does not include an optics system. The light emitted by the light source 340 is projected directly to the waveguide 320 (shown in FIG. 3A).

The controller 330 controls the operations of light source 340 and, in some cases, the optics system 345. In some embodiments, the controller 330 may be the graphics processing unit (GPU) of a display device. In other embodiments, the controller 330 may be other kinds of processors. The operations performed by the controller 330 includes taking content for display, and dividing the content into discrete sections. The controller 330 instructs the light source 340 to sequentially present the discrete sections using light emitters corresponding to a respective row in an image ultimately displayed to the user. The controller 330 instructs the optics system 345 to perform different adjustment of the light. For example, the controller 330 controls the optics system 345 to scan the presented discrete sections to different areas of a coupling element of the output waveguide 320 (shown in FIG. 3A). Accordingly, at the exit pupil of the output waveguide 320, each discrete portion is presented in a different location. While each discrete section is presented at different times, the presentation and scanning of the discrete sections occur fast enough such that a user's eye integrates the different sections into a single image or series of images. The controller 330 may also provide scanning instructions to the light source 340 that include an address corresponding to an individual source element of the light source 340 and/or an electrical bias applied to the individual source element.

The image processing unit 375 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, the image processing unit 375 may be one or more circuits that are dedicated to performing certain features. While in FIG. 3B the image processing unit 375 is shown as a stand-alone unit that is separate from the controller 330 and the driving circuit 370, in other embodiments the image processing unit 375 may be a sub-unit of the controller 330 or the driving circuit 370. In other words, in those embodiments, the controller 330 or the driving circuit 370 performs various image processing procedures of the image processing unit 375. The image processing unit 375 may also be referred to as an image processing circuit.

Light Emitters

FIGS. 4A through 4E are conceptual diagrams that illustrate different light emitters' structure and arrangement, in accordance with various embodiments. Light emitters may also be referred to as light-emitting devices.

Figure 4A:
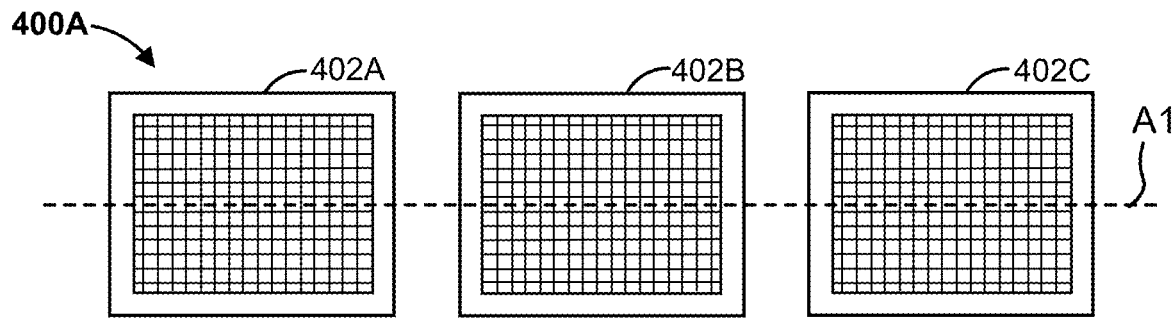
FIGS. 4A, 4B, and 4C are conceptual diagrams illustrating different arrangements of light emitters, in accordance with some embodiments.
Figure 4B:
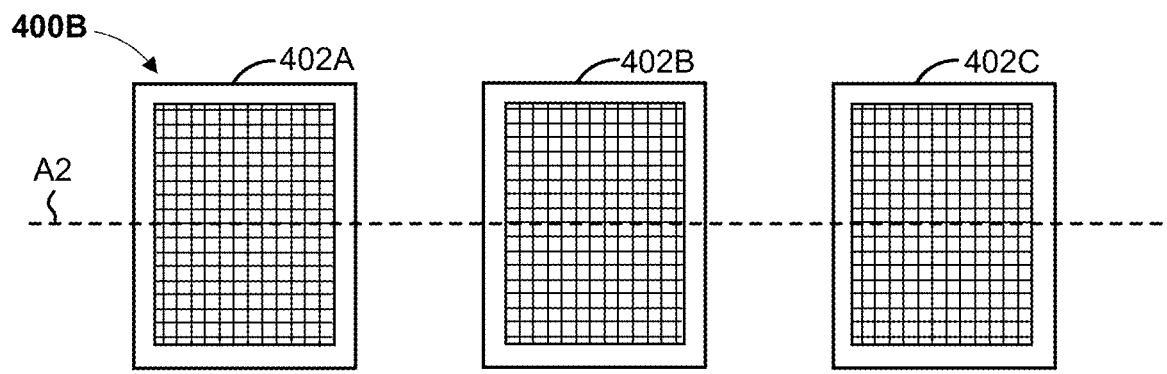
Figure 4C:
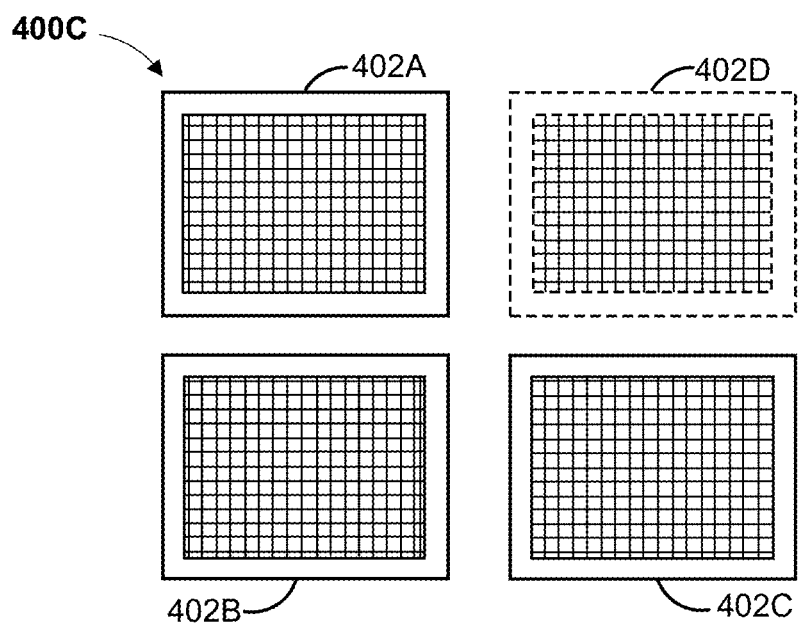

FIGS. 4A, 4B, and 4C are top views of matrix arrangement of light emitters that may be included in the light source 340 of FIGS. 3A and 3B, in accordance to some embodiments. The configuration 400A shown in FIG. 4A is a linear configuration of the light emitter arrays 402A through 402C of FIG. 4A along the axis A1. This particular linear configuration may be arranged according to a longer side of the rectangular light emitter arrays 402. Each light emitter array 402 may also be referred to as a light-emitting assembly. While the light emitter arrays 402 may have a square configuration of light emitters in some embodiments, other embodiments may include a rectangular configuration of light emitters. The light emitter arrays 402A through 402C each include multiple rows and columns of light emitters.

Each light emitter array 402A through 402C may include light emitters of a single color. For example, light emitter array 402A may include red light emitters, light emitter array 402B may include green light emitters, and light emitter array 402C may include blue light emitters.

In other embodiments, the light emitter arrays 402A through 402C may have other configurations (e.g., oval, circular, or otherwise rounded in some fashion) while defining a first dimension (e.g., a width) and a second dimension (e.g., length) orthogonal to the first direction, with one dimension being either equal or unequal to each other. In FIG. 4B, the light emitter arrays 402A through 402C may be disposed in a linear configuration 400B according to a shorter side of the rectangular light emitter arrays 402, along an axis A2. FIG. 4C shows a triangular configuration of the light emitter arrays 402A through 402C in which the centers of the light emitter arrays 402 form a non-linear (e.g., triangular) shape or configuration. Some embodiments of the configuration 400C of FIG. 4C may further include a white-light emitter array 402D, such that the light emitter arrays 402 are in a rectangular or square configuration. The light emitter arrays 402 may have a two-dimensional light emitter configuration with more than 1000 by 1000 light emitters, in some embodiments. Various other configurations are also within the scope of the present disclosure.

While the matrix arrangements of light emitters shown in FIGS. 4A through 4C are arranged in perpendicular rows and columns, in other embodiments the matrix arrangements may be arranged other forms. For example, some of the light emitters may be aligned diagonally or in other arrangements, regular or irregular, symmetrical or asymmetrical. Also, the terms rows and columns may describe two relative spatial relationships of elements. While, for the purpose of simplicity, a column described herein is normally associated with a vertical line of elements, it should be understood that a column does not have to be arranged vertically (or longitudinally). Likewise, a row does not have to be arranged horizontally (or laterally). A row and a column may also sometimes describe an arrangement that is non-linear. Rows and columns also do not necessarily imply any parallel or perpendicular arrangement. Sometimes a row or a column may be referred to as a line. Also, in some embodiments, the light emitters may not be arranged in a matrix configuration. For example, in some display devices that include a rotating mirror that will be discussed in further details in FIG. 5A, there may be a single line of light emitters for each color. In other embodiments, there may be two or three lines of light emitters for each color.

Figure 4D:
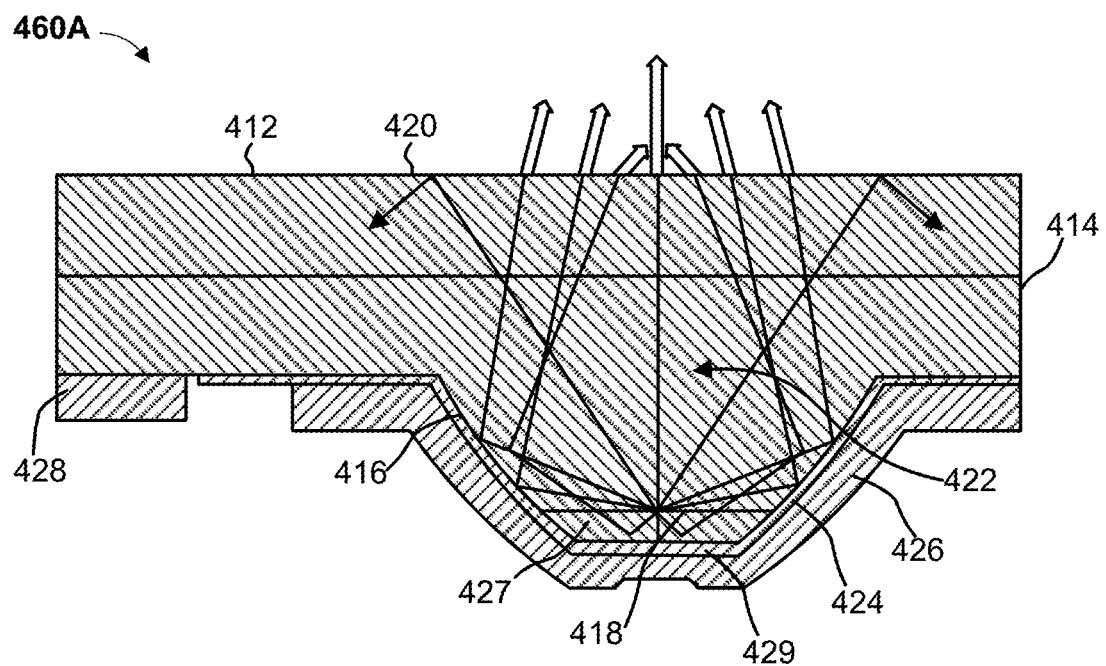
FIGS. 4D and 4E are schematic cross-sectional diagrams of light emitters, in accordance with some embodiments.
Figure 4E:
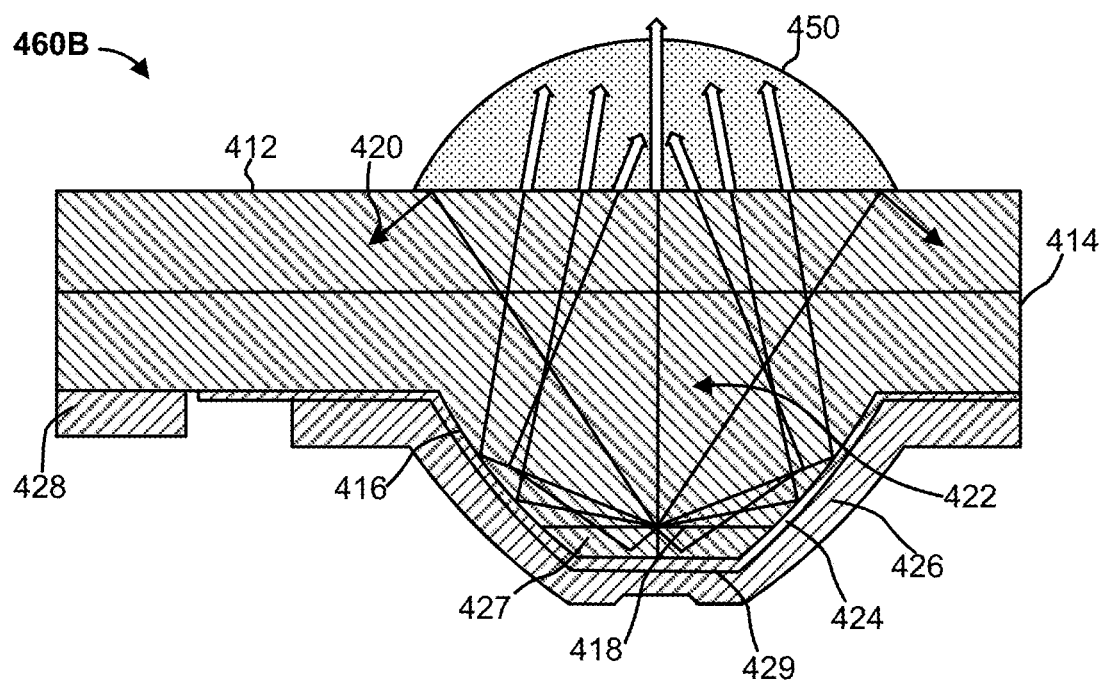

FIGS. 4D and 4E are schematic cross-sectional diagrams of an example of light emitters 410 that may be used as an individual light-emitting device in the light emitter arrays 402 of FIGS. 4A-C, in accordance with some embodiments. In one embodiment, the light emitter 410 may be microLED 460A. In other embodiments, other types of light emitters may be used and do not need to be microLED. FIG. 4D shows a schematic cross-section of a microLED 460A. A "microLED" may be a particular type of LED having a small active light emitting area (e.g., less than 2,000 $\mu m^2$ in some embodiments, less than 20 $\mu m^2$ or less than 10 $\mu m^2$ in other embodiments). In some embodiments, the emissive surface of the microLED 460A may have a diameter of less than approximately 5 $\mu m$, although smaller (e.g., 2 $\mu m$) or larger diameters for the emissive surface may be utilized in other embodiments. The microLED 460A may also have collimated or non-Lambertian light output, in some examples, which may increase the brightness level of light emitted from a small active light-emitting area.

The microLED 460A may include, among other components, an LED substrate 412 with a semiconductor epitaxial layer 414 disposed on the substrate 412, a dielectric layer 424 and a p-contact 429 disposed on the epitaxial layer 414, a metal reflector layer 426 disposed on the dielectric layer 424 and p-contact 429, and an n-contact 428 disposed on the epitaxial layer 414. The epitaxial layer 414 may be shaped into a mesa 416. An active light-emitting area 418 may be formed in the structure of the mesa 416 by way of a p-doped region 427 of the epitaxial layer 414. The active light-emitting area 418 may also be referred to as an optical output location.

The substrate 412 may include transparent materials such as sapphire or glass. In one embodiment, the substrate 412 may include silicon, silicon oxide, silicon dioxide, aluminum oxide, sapphire, an alloy of silicon and germanium, indium phosphide (InP), and the like. In some embodiments, the substrate 412 may include a semiconductor material (e.g., monocrystalline silicon, germanium, silicon germanium (SiGe), and/or a III-V based material (e.g., gallium arsenide), or any combination thereof. In various embodiments, the substrate 412 can include a polymer-based substrate, glass, or any other bendable substrate including two-dimensional materials (e.g., graphene and molybdenum disulfide), organic materials (e.g., pentacene), transparent oxides (e.g., indium gallium zinc oxide (IGZO)), polycrystalline III-V materials, polycrystalline germanium, polycrystalline silicon, amorphous III-V materials, amorphous germanium, amorphous silicon, or any combination thereof. In some embodiments, the substrate 412 may include a III-V compound semiconductor of the same type as the active LED (e.g., gallium nitride). In other examples, the substrate 412 may include a material having a lattice constant close to that of the epitaxial layer 414.

The epitaxial layer 414 may include gallium nitride (GaN) or gallium arsenide (GaAs). The active layer 418 may include indium gallium nitride (InGaN). The type and structure of semiconductor material used may vary to produce microLEDs that emit specific colors. In one embodiment, the semiconductor materials used can include a III-V semiconductor material. III-V semiconductor material layers can include those materials that are formed by combining group III elements (Al, Ga, In, etc.) with group V elements (N, P, As, Sb, etc.). The p-contact 429 and n-contact 428 may be contact layers formed from indium tin oxide (ITO) or another conductive material that can be transparent at the desired thickness or arrayed in a grid-like pattern to provide for both good optical transmission/transparency and electrical contact, which may result in the microLED 460A also being transparent or substantially transparent. In such examples, the metal reflector layer 426 may be omitted. In other embodiments, the p-contact 429 and the n-contact 428 may include contact layers formed from conductive material (e.g., metals) that may not be optically transmissive or transparent, depending on pixel design.

In some implementations, alternatives to ITO can be used, including wider-spectrum transparent conductive oxides (TCOs), conductive polymers, metal grids, carbon nanotubes (CNT), graphene, nanowire meshes, and thin-metal films. Additional TCOs can include doped binary compounds, such as aluminum-doped zinc-oxide (AZO) and indium-doped cadmium-oxide. Additional TCOs may include barium stannate and metal oxides, such as strontium vanadate and calcium vanadate. In some implementations, conductive polymers can be used. For example, a poly(3,4-ethylenedioxythiophene) PEDOT: poly(styrene sulfonate) PSS layer can be used. In another example, a poly(4,4-dioctyl cyclopentadithiophene) material doped with iodine or 2,3-dichloro-5,6-dicyano-1,4-benzoquinone (DDQ) can be used. The example polymers and similar materials can be spin-coated in some example embodiments.

In some embodiments, the p-contact 429 may be of a material that forms an ohmic contact with the p-doped region 427 of the mesa 416. Examiner of such materials may include, but are not limited to, palladium, nickel oxide deposited as a NiAu multilayer coating with subsequent oxidation and annealing, silver, nickel oxide/silver, gold/zinc, platinum gold, or other combinations that form ohmic contacts with p-doped III-V semiconductor material.

The mesa 416 of the epitaxial layer 414 may have a truncated top on a side opposed to a substrate light emissive surface 420 of the substrate 412. The mesa 416 may also have a parabolic or near-parabolic shape to form a reflective enclosure or parabolic reflector for light generated within the microLED 460A. However, while FIG. 4D depicts a parabolic or near-parabolic shape for the mesa 416, other shapes for the mesa 416 are possible in other embodiments. The arrows indicate how light 422 emitted from the active layer 418 may be reflected off the internal walls of the mesa 416 toward the light emissive surface 420 at an angle sufficient for the light to escape the microLED 460A (i.e., outside an angle of total internal reflection). The p-contact 429 and the n-contact 428 may electrically connect the microLED 460A to a substrate.

The parabolic-shaped structure of the microLED 460A may result in an increase in the extraction efficiency of the microLED 460A into low illumination angles when compared to unshaped or standard LEDs. Standard LED dies may generally provide an emission full width at half maximum (FWHM) angle of 120°. In comparison, the microLED 460A can be designed to provide controlled emission angle FWHM of less than standard LED dies, such as around 41°. This increased efficiency and collimated output of the microLED 460A can enable improvement in overall power efficiency of the NED, which can be important for thermal management and/or battery life.

The microLED 460A may include a circular cross-section when cut along a horizontal plane, as shown in FIG. 4D. However, the microLED 460A cross-section may be non-circular in other examples. The microLED 460A may have a parabolic structure etched directly onto the LED die during the wafer processing steps. The parabolic structure may include the active light-emitting area 418 of the microLED 460A to generate light, and the parabolic structure may reflect a portion of the generated light to form the quasi-collimated light 422 emitted from the substrate light emissive surface 420. In some examples, the optical size of the microLED 460A may be smaller than or equal to the active light-emitting area 418. In other embodiments, the optical size of the microLED 460A may be larger than the active light-emitting area 418, such as through a refractive or reflective approach, to improve usable brightness of the microLED 460A, including any chief ray angle (CRA) offsets to be produced by the light emitter array 402.

FIG. 4E depicts a microLED 460B that is similar in many respects to the microLED 460A of FIG. 4D. The microLED 460B may further include a microlens 450, which may be formed over the parabolic structure. In some embodiments, the microlens 450 may be formed by applying a polymer coating over the microLED 460A, patterning the coating, and reflowing the coating to achieve the desired lens curvature. The microlens 450 may be disposed over an emissive surface to alter a chief ray angle of the microLED 460B. In another embodiment, the microlens 450 may be formed by depositing a microlens material above the microLED 460A (for example, by a spin-on method or a deposition process). For example, a microlens template (not shown) having a curved upper surface can be patterned above the microlens material. In some embodiments, the microlens template may include a photoresist material exposed using a distributing exposing light dose (e.g., for a negative photoresist, more light is exposed at a bottom of the curvature and less light is exposed at a top of the curvature), developed, and baked to form a rounding shape. The microlens 450 can then be formed by selectively etching the microlens material according to the microlens template. In some embodiments, the shape of the microlens 450 may be formed by etching into the substrate 412. In other embodiments, other types of light-shaping or light-distributing elements, such as an annular lens, Fresnel lens, or photonic crystal structures, may be used instead of microlenses.

In some embodiments, microLED arrangements other than those specifically discussed above in conjunction with FIGS. 4D and 4E may be employed as a microLED in light emitter array 402. For example, the microLED may include isolated pillars of epitaxially grown light-emitting material surrounded by a metal reflector. The pixels of the light emitter array 402 may also include clusters of small pillars (e.g., nanowires) of epitaxially grown material that may or may not be surrounded by reflecting material or absorbing material to prevent optical crosstalk. In some examples, the microLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as microlenses, diffractive structures, or photonic crystals. Other processes for fabricating the microLEDs of the dimensions noted above other than those specifically disclosed herein may be employed in other embodiments.

Figure 5A:
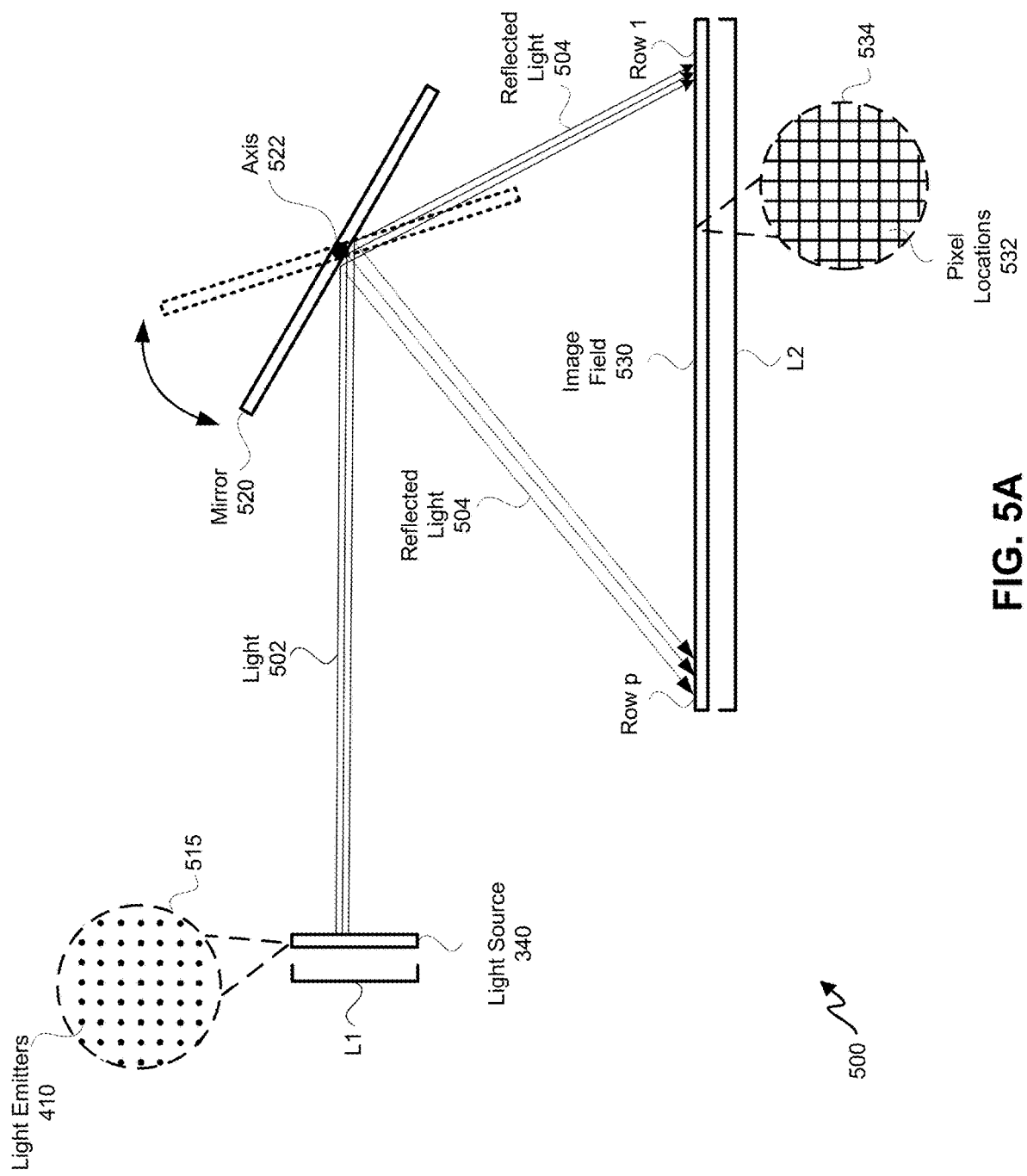
FIG. 5A is a diagram illustrating a scanning operation of a display device using a mirror to project light from a light source to an image field, in accordance with an embodiment.
Figure 5B:
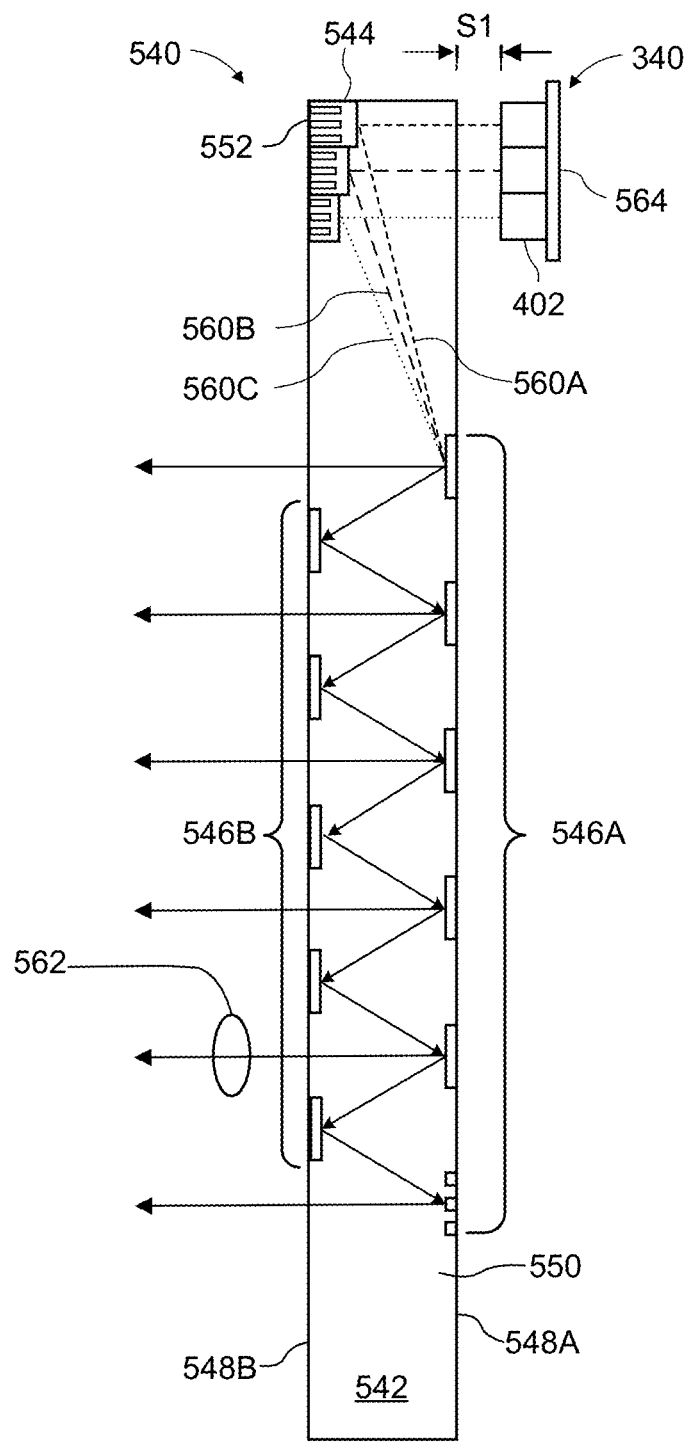
FIG. 5B is a diagram illustrating a waveguide configuration, in accordance with an embodiment.

FIGS. 5A and 5B illustrate how images and pupil replications are formed in a display device based on different structural arrangements of light emitters, in accordance with different embodiments. An image field is an area that receives the light emitted by the light source and forms an image. For example, an image field may correspond to a portion of the coupling element 350 or a portion of the decoupling element 360 in FIG. 3A. In some cases, an image field is not an actual physical structure but is an area to which the image light is projected and which the image is formed. In one embodiment, the image field is a surface of the coupling element 350 and the image formed on the image field is magnified as light travels through the output waveguide 320. In another embodiment, an image field is formed after light passing through the waveguide which combines the light of different colors to form the image field. In some embodiments, the image field may be projected directly into the user's eyes.

FIG. 5A is a diagram illustrating a scanning operation of a display device 500 using a scanning mirror 520 to project light from a light source 340 to an image field 530, in accordance with an embodiment. The display device 500 may correspond to the near-eye display 100 or another scan-type display device. The light source 340 may correspond to the light source 340 shown in FIG. 3B, or may be used in other display devices. The light source 340 includes multiple rows and columns of light emitters 410, as represented by the dots in inset 515. In one embodiment, the light source 340 may include a single line of light emitters 410 for each color. In other embodiments, the light source 340 may include more than one lines of light emitters 410 for each color. The light 502 emitted by the light source 340 may be a set of collimated beams of light. For example, the light 502 in FIG. 5 shows multiple beams that are emitted by a column of light emitters 410. Before reaching the mirror 520, the light 502 may be conditioned by different optical devices such as the conditioning assembly 430 (shown in FIG. 3B but not shown in FIG. 5). The mirror 520 reflects and projects the light 502 from the light source 340 to the image field 530. The mirror 520 rotates about an axis 522. The mirror 520 may be a microelectromechanical system (MEMS) mirror or any other suitable mirror. The mirror 520 may be an embodiment of the optics system 345 in FIG. 3B or a part of the optics system 345. As the mirror 520 rotates, the light 502 is directed to a different part of the image field 530, as illustrated by the reflected part of the light 504 in solid lines and the reflected part of the light 504 in dash lines.

At a particular orientation of the mirror 520 (i.e., a particular rotational angle), the light emitters 410 illuminate a portion of the image field 530 (e.g., a particular subset of multiple pixel locations 532 on the image field 530). In one embodiment, the light emitters 410 are arranged and spaced such that a light beam from each light emitter 410 is projected on a corresponding pixel location 532. In another embodiment, small light emitters such as microLEDs are used for light emitters 410 so that light beams from a subset of multiple light emitters are together projected at the same pixel location 532. In other words, a subset of multiple light emitters 410 collectively illuminates a single pixel location 532 at a time.

The image field 530 may also be referred to as a scan field because, when the light 502 is projected to an area of the image field 530, the area of the image field 530 is being illuminated by the light 502. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the light 502 from the light source 340. For example, at a given angle of rotation of the mirror 520, light beams emitted from the light source 340 may fall on an area of the image field 530. As such, the sizes and locations of pixel locations 532 of the image field 530 may be defined based on the location of each light beam. In some cases, a pixel location 532 may be subdivided spatially into subpixels (not shown). For example, a pixel location 532 may include a Red subpixel, a Green subpixel, and a Blue subpixel. The Red subpixel corresponds to a location at which one or more Red light beams are projected, etc. When subpixels are present, the color of a pixel 532 is based on the temporal and/or spatial average of the subpixels.

The number of rows and columns of light emitters 410 of the light source 340 may or may not be the same as the number of rows and columns of the pixel locations 532 in the image field 530. In one embodiment, the number of light emitters 410 in a row is equal to the number of pixel locations 532 in a row of the image field 530 while the number of light emitters 410 in a column is two or more but fewer than the number of pixel locations 532 in a column of the image field 530. Put differently, in such embodiment, the light source 340 has the same number of columns of light emitters 410 as the number of columns of pixel locations 532 in the image field 530 but has fewer rows than the image field 530. For example, in one specific embodiment, the light source 340 has about 1280 columns of light emitters 410, which is the same as the number of columns of pixel locations 532 of the image field 530, but only a handful of light emitters 410. The light source 340 may have a first length L1, which is measured from the first row to the last row of light emitters 410. The image field 530 has a second length L2, which is measured from row 1 to row p of the scan field 530. In one embodiment, L2 is greater than L1 (e.g., L2 is 50 to 10,000 times greater than L1).

Since the number of rows of pixel locations 532 is larger than the number of rows of light emitters 410 in some embodiments, the display device 500 uses the mirror 520 to project the light 502 to different rows of pixels at different times. As the mirror 520 rotates and the light 502 scans through the image field 530 quickly, an image is formed on the image field 530. In some embodiments, the light source 340 also has a smaller number of columns than the image field 530. The mirror 520 can rotate in two dimensions to fill the image field 530 with light (e.g., a raster-type scanning down rows then moving to new columns in the image field 530).

The display device may operate in predefined display periods. A display period may correspond to a duration of time in which an image is formed. For example, a display period may be associated with the frame rate (e.g., a reciprocal of the frame rate). In the particular embodiment of display device 500 that includes a rotating mirror, the display period may also be referred to as a scanning period. A complete cycle of rotation of the mirror 520 may be referred to as a scanning period. A scanning period herein refers to a predetermined cycle time during which the entire image field 530 is completely scanned. The scanning of the image field 530 is controlled by the mirror 520. The light generation of the display device 500 may be synchronized with the rotation of the mirror 520. For example, in one embodiment, the movement of the mirror 520 from an initial position that projects light to row 1 of the image field 530, to the last position that projects light to row p of the image field 530, and then back to the initial position is equal to a scanning period. The scanning period may also be related to the frame rate of the display device 500. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 reverts back to the initial position to project light onto the first few rows of the image field 530 again, except that a new set of driving signals may be fed to the light emitters 410. The same process may be repeated as the mirror 520 rotates in cycles. As such, different images are formed in the scanning field 530 in different frames.

FIG. 5B is a conceptual diagram illustrating a waveguide configuration to form an image and replications of images that may be referred to as pupil replications, in accordance with an embodiment. In this embodiment, the light source of the display device may be separated into three different light emitter arrays 402, such as based on the configurations shown in FIGS. 4A and 4B. The primary colors may be red, green, and blue or another combination of other suitable primary colors. In one embodiment, the number of light emitters in each light emitter array 402 may be equal to the number of pixel locations an image field (not shown in FIG. 5B). As such, contrary to the embodiment shown in FIG. 5A that uses a scanning operation, each light emitter may be dedicated to generating images at a pixel location of the image field. In another embodiment, the configuration shown in FIGS. 5A and 5B may be combined. For example, the configuration shown in FIG. 5B may be located downstream of the configuration shown in FIG. 5A so that the image formed by the scanning operation in FIG. 5A may further be replicated to generate multiple replications.

The embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eyebox 230 may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configurations that provide for pupil replication, as described herein, may provide for one-dimensional replication, while other embodiments may provide for two-dimensional replication. For simplicity, one-dimensional pupil replication is shown in FIG. 5B. Two-dimensional pupil replication may include directing light into and outside the plane of FIG. 5B. FIG. 5B is presented in a simplified format. The detected gaze of the user may be used to adjust the position and/or orientation of the light emitter arrays 402 individually or the light source 340 as a whole and/or to adjust the position and/or orientation of the waveguide configuration.

In FIG. 5B, a waveguide configuration 540 is disposed in cooperation with a light source 340, which may include one or more monochromatic light emitter arrays 402 secured to a support structure 564 (e.g., a printed circuit board or another structure). The support structure 564 may be coupled to the frame 105 of FIG. 1. The waveguide configuration 540 may be separated from the light source 340 by an air gap having a distance S1. The distance S1 may be in a range from approximately 50 μm to approximately 500 μm in some examples. The monochromatic image or images projected from the light source 340 may pass through the air gap toward the waveguide configuration 540. Any of the light source embodiments described herein may be utilized as the light source 340.

The waveguide configuration may include a single waveguide 542 or multiple waveguides 542, which may be formed from a glass or plastic material. The waveguide 542 may include a coupling area 544 and a decoupling area formed by decoupling elements 546A on a top surface 548A and decoupling elements 546B on a bottom surface 548B in some embodiments. The area within the waveguide 542 in between the decoupling elements 546A and 546B may be considered a propagation area 550, in which light images received from the light source 340 and coupled into the waveguide 542 by coupling elements included in the coupling area 544 may propagate laterally within the waveguide 542.

The coupling area 544 may include a coupling element 552 configured and dimensioned to couple light of a predetermined wavelength, e.g., red, green, or blue light. When a white light emitter array is included in the light source 340, the portion of the white light that falls in the predetermined wavelength may be coupled by each of the coupling elements 552. In some embodiments, the coupling elements 552 may be gratings, such as Bragg gratings, dimensioned to couple a predetermined wavelength of light. In some examples, the gratings of each coupling element 552 may exhibit a separation distance between gratings associated with the predetermined wavelength of light that the particular coupling element 552 is to couple into the waveguide 542, resulting in different grating separation distances for each coupling element 552. Accordingly, each coupling element 552 may couple a limited portion of the white light from the white light emitter array when included. In other examples, the grating separation distance may be the same for each coupling element 552. In some examples, coupling element 552 may be or include a multiplexed coupler.

As shown in FIG. 5B, a red image 560A, a blue image 560B, and a green image 560C may be coupled by the coupling elements of the coupling area 544 into the propagation area 550 and may begin traversing laterally within the waveguide 542. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations. In various embodiments, one or more waveguides may be used. For example, in one embodiment, each monochromatic light emitter array 402 may project light to its respective waveguide in a larger waveguide stack that combines the three color channels. In another embodiment, two monochromatic light emitter arrays 402 may project light to a first waveguide and another monochromatic light emitter array 402 may project light to a second waveguide. The display device may include a third waveguide to converge the light of the three color channels. In other embodiments, other suitable combinations of waveguides and light projection arrangement may also be possible.

A portion of the light may be projected out of the waveguide 542 after the light contacts the decoupling element 546A for one-dimensional pupil replication, and after the light contacts both the decoupling element 546A and the decoupling element 546B for two-dimensional pupil replication. In two-dimensional pupil replication embodiments, the light may be projected out of the waveguide 542 at locations where the pattern of the decoupling element 546A intersects the pattern of the decoupling element 546B.

The portion of light that is not projected out of the waveguide 542 by the decoupling element 546A may be reflected off the decoupling element 546B. The decoupling element 546B may reflect all incident light back toward the decoupling element 546A, as depicted. Accordingly, the waveguide 542 may combine the red image 560A, the blue image 560B, and the green image 560C into a polychromatic image instance, which may be referred to as a pupil replication 562. The polychromatic pupil replication 562 may be projected toward the eyebox 230 of FIG. 2 and to the eye 220, which may interpret the pupil replication 562 as a full-color image (e.g., an image including colors in addition to red, green, and blue). The waveguide 542 may produce tens or hundreds of pupil replications 562 or may produce a single replication 562.

In some embodiments, the waveguide configuration may differ from the configuration shown in FIG. 5B. For example, the coupling area may be different. Rather than including gratings as coupling element 552, an alternate embodiment may include a prism that reflects and refracts received image light, directing it toward the decoupling element 706A. Also, while FIG. 5B generally shows the light source 340 having multiple light emitters arrays 402 coupled to the same support structure 564, other embodiments may employ a light source 340 with separate monochromatic emitters arrays 402 located at disparate locations about the waveguide configuration (e.g., one or more emitters arrays 402 located near a top surface of the waveguide configuration and one or more emitters arrays 402 located near a bottom surface of the waveguide configuration).

Also, although only three light emitter arrays are shown in FIG. 5B, an embodiment may include more or fewer light emitter arrays. For example, in one embodiment, a display device may include two red arrays, two green arrays, and two blue arrays. In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset. The separation of most and least significant bits of a color dataset will be discussed in further detail below in FIG. 6.

While FIGS. 5A and 5B show different ways an image may be formed in a display device, the configurations shown in FIGS. 5A and 5B are not mutually exclusive. For example, in one embodiment, a display device may use both a rotating mirror and a waveguide to form an image and also to form multiple pupil replications.

Figure 5C:
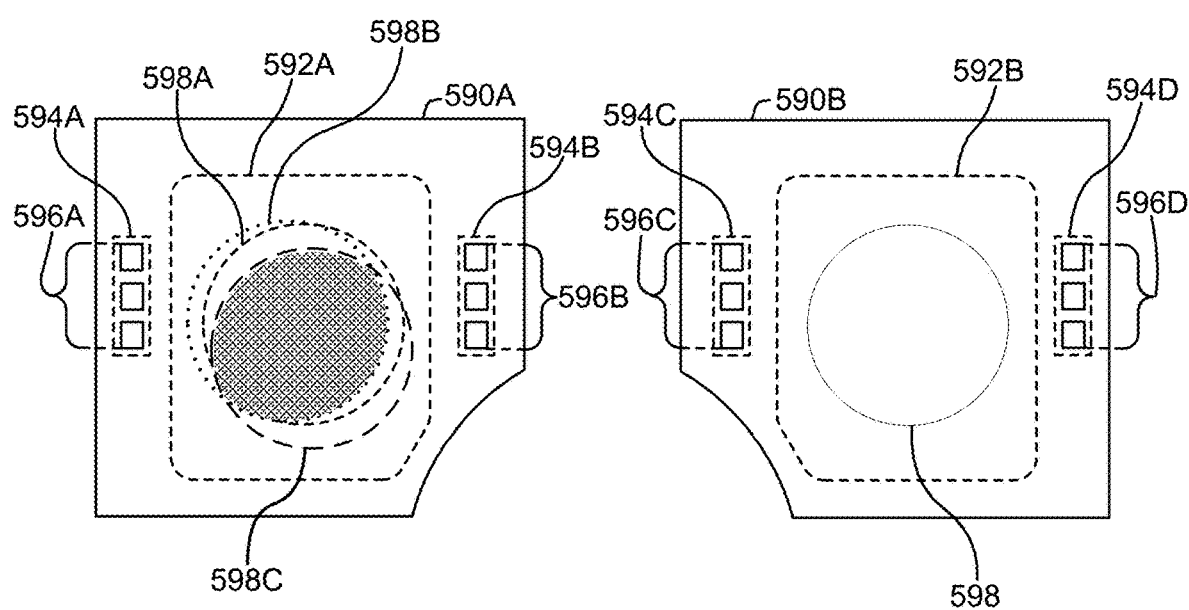
FIG. 5C is a top view of a display device, in accordance with an embodiment.

FIG. 5C is a top view of a display system (e.g., an NED), in accordance with an embodiment. The NED 570 in FIG. 9A may include a pair of waveguide configurations. Each waveguide configuration projects images to an eye of a user. In some embodiments not shown in FIG. 5C, a single waveguide configuration that is sufficiently wide to project images to both eyes may be used. The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by a light emitter array set 596A and a light emitter array set 596B, respectively. Each of the light emitter array sets 596 may include a plurality of monochromatic light emitter arrays, as described herein. As shown, the light emitter array sets 596 may each include a red light emitter array, a green light emitter array, and a blue light emitter array. As described herein, some light emitter array sets may further include a white light emitter array or a light emitter array emitting some other color or combination of colors.

The right eye waveguide 590A may include one or more coupling areas 594A, 594B, 594C, and 594D (all or a portion of which may be referred to collectively as coupling areas 594) and a corresponding number of light emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two light emitter array sets 596, other embodiments may include more or fewer. In some embodiments, the individual light emitter arrays of a light emitter array set may be disposed at different locations around a decoupling area. For example, the light emitter array set 596A may include a red light emitter array disposed along a left side of the decoupling area 592A, a green light emitter array disposed along the top side of the decoupling area 592A, and a blue light emitter array disposed along the right side of the decoupling area 592A. Accordingly, light emitter arrays of a light emitter array set may be disposed all together, in pairs, or individually, relative to a decoupling area.

The left eye waveguide 590B may include the same number and configuration of coupling areas 594 and light emitter array sets 596 as the right eye waveguide 590A, in some embodiments. In other embodiments, the left eye waveguide 590B and the right eye waveguide 590A may include different numbers and configurations (e.g., positions and orientations) of coupling areas 594 and light emitter array sets 596. Included in the depiction of the left waveguide 590A and the right waveguide 590B are different possible arrangements of pupil replication areas of the individual light emitter arrays included in one light emitter array set 596. In one embodiment, the pupil replication areas formed from different color light emitters may occupy different areas, as shown in the left waveguide 590A. For example, a red light emitter array of the light emitter array set 596 may produce pupil replications of a red image within the limited area 598A. A green light emitter array may produce pupil replications of a green image within the limited area 598B. A blue light emitter array may produce pupil replications of a blue image within the limited area 598C. Because the limited areas 598 may be different from one monochromatic light emitter array to another, only the overlapping portions of the limited areas 598 may be able to provide full-color pupil replication, projected toward the eyebox 230. In another embodiment, the pupil replication areas formed from different color light emitters may occupy the same space, as represented by a single solid-lined circle 598 in the right waveguide 590B.

In one embodiment, waveguide portions 590A and 590B may be connected by a bridge waveguide (not shown). The bridge waveguide may permit light from the light emitter array set 596A to propagate from the waveguide portion 590A into the waveguide portion 590B. Similarly, the bridge waveguide may permit light emitted from the light emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detector (e.g. a photodetector), such as to detect image misalignment between the waveguide portions 590A and 590B.

Light-Emitting Assemblies

Figure 6A:
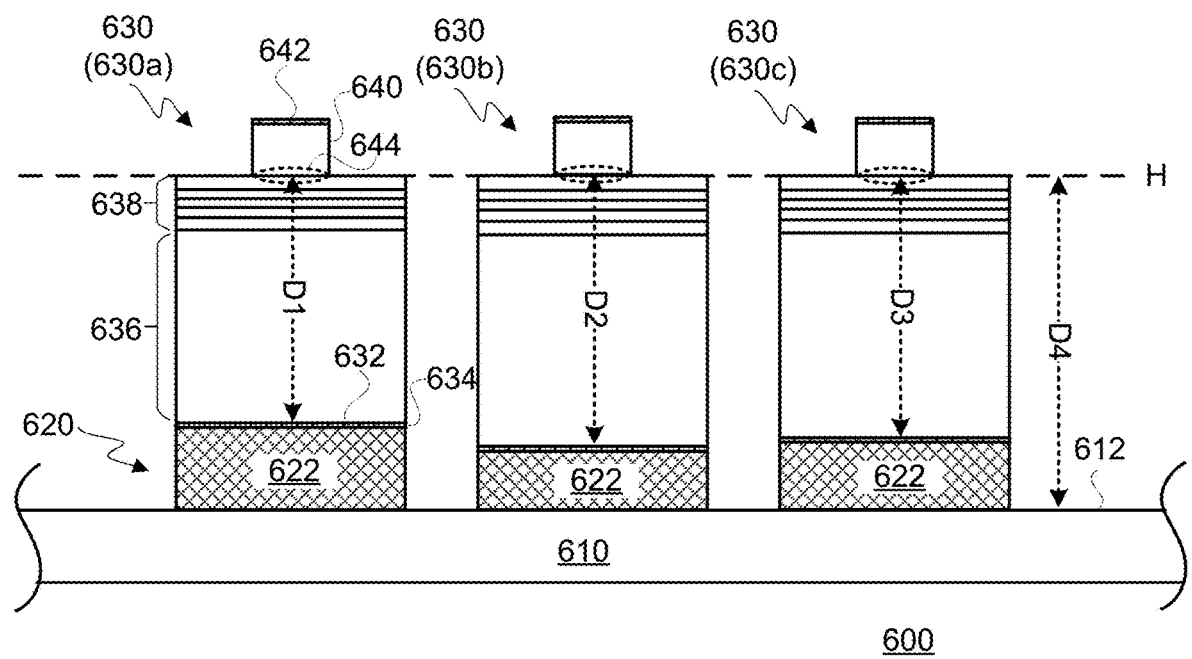
FIG. 6A is a cross sectional diagram illustrating a configuration of a light-emitting assembly having N-electrodes of light-emitting devices mounted onto a substrate, in accordance with an embodiment.

FIG. 6A is a cross sectional diagram illustrating a configuration of a light-emitting assembly 600 having N-electrodes of light-emitting devices mounted onto a substrate, in accordance with an embodiment. The light-emitting assembly 600 may be a source array used in a display device, such as the source array 402 or light source 340 used in the NED 100, or a part of a source array. The light-emitting assembly 600 may also be used as a light source for other display devices. The light-emitting assembly 600 includes a substrate 610, an interconnect layer 620, and a plurality of light-emitting devices 630, which may also be referred to as light emitters.

Depending on the embodiments, the substrate 610 may be a back-plane circuit that electrically couples to the light-emitting devices 630, a sub-mount positioned between the light-emitting devices 630 and a back-plane circuit, or any suitable structure used to structurally hold the light-emitting devices 630. A back-plane circuit provides power to the light-emitting devices 630 and may be connected to a controller or may be a part of a system on a chip. The light-emitting devices 630 are positioned on a surface 612 of the substrate 610 via the interconnect layer 620.

The interconnect layer 620 conductively couples the light-emitting devices 630 to the substrate 610. The interconnect layer 620 serves as a pathway for electrical signals and heat exchange between the light-emitting devices 630 and the substrate 610. The interconnect layer 620 can include a plurality of nano-porous metal blocks 622, which may also be referred to as nano-porous pads. Each nano-porous metal block 622 may be a discrete block that is separated from each other. In one case, each light-emitting device 630 is positioned on and conductively coupled to a single nano-porous metal block 622, as shown in the embodiment illustrated in FIG. 6A. In another case, each light-emitting device 630 is positioned on and conductively coupled to multiple nano-porous metal blocks 622, as shown in other embodiments described associated with, for example, FIGS. 8, 9A, and 9B below. Each nano-porous metal block 622 may have a different thickness.

The nano-porous metal blocks 622 can be formed of metallic materials based on the materials' thermal conductivity, electrical conductivity, and compressibility. In one embodiment, the nano-porous metal blocks 622 is formed of nano-porous gold. Nano-porous gold may be used because gold has good thermal and electrical conductivity and also because nano-porous gold is highly malleable so that the nano-porous gold can serve as compressible material. Other materials such as copper, silver, gold, platinum, and/or alloys of some combination thereof can be used. In other embodiments, the nano-porous metal blocks 622 may include other metals, semi-metals or conductive non-metals. In one embodiment, the nano-porous metal blocks 622 may have heights in a range from 10's of microns to sub-micron with an aspect ratio of 1:1 or higher. Each nano-porous metal block 622 includes a plurality of pores that are distributed across the block. The pores may have a size of approximately 100 nm or smaller, depending upon the material and the process used in forming the nano-porous structure. A nano-porous metal block sometimes may be referred to as a nano-metallic block.

In the case of nano-porous gold, the nano-porous metal blocks 622 may be fabricated by using a plating process followed by selective dissolution, which is also known as dealloying. For example, the nano-porous metal blocks 622 can be formed by providing a seed layer, depositing a gold-based alloy, e.g., Au—Ag alloy, onto the seed layer, and dealloying the gold-based alloy to remove the silver to form the pores. Tertiary alloy compositions such as Au—Ag—Pt could also be employed. During the deploying process, silver is removed from the alloy in a strong corrosive environment, producing an open pore network structure that consists mostly of gold. Morphology of the nano-porous metal blocks 622 may be further modified by thermal treatment. For example, the nano-porous metal blocks 622 may be heated to increase in surface diffusion of gold atoms to increase average pore size.

It should be noted that the structure shown in FIG. 6A (and other similar figures) is for illustration purpose only. Despite not being shown or discussed, there can be additional layers, structure, coatings, etc. present in between the light-emitting devices 630, the nano-porous metal blocks 622, and/or the substrate 610. The terms "coupled to," "coupled with," "mounted on," "attached to" do not require one element be directly in contact with another element. In some embodiments, additional structures are present in the interconnect layer 620. For those embodiments, the structure of the interconnection between a light-emitting device 630 and the substrate 610 via the interconnect layer 620 is further described in U.S. patent application Ser. No. 15/875,865, entitled "Connecting Conductive Pads with Post-Transition Metal and Nanoporous Metal," filed on Jan. 19, 2018, which is hereby incorporated by reference in its entirety for all purposes.

The light-emitting devices 630 may be superluminous diodes (SLEDs or SLDs), laser diodes (LDs), vertical cavity surface emitting laser (VCSEL) devices, light emitting diodes (LEDs), tunable lasers, and/or some other light-emitting devices. While three light-emitting devices 630 are shown in FIG. 6A, it should be noted that a light-emitting assembly 600 may include any numbers of light-emitting devices 630. For example, the light-emitting assembly 600 may include a matrix of light-emitting devices 630 that are arranged in rows and columns. In one embodiment, there are multiple rows of light-emitting devices 630 arranged in 1024 columns. In another embodiment, a light-emitting assembly 600 may include a single row of light-emitting devices. The light-emitting assembly 600 may also include different kinds of light-emitting devices 630 that emit light in different wavelengths. In one embodiment, the light-emitting assembly 600 may include a first group of multiple rows of light-emitting devices 630 that emit red light, a second group of multiple rows of light-emitting devices 630 that emit green light, and a third group of multiple rows of light-emitting devices 630 that emit blue light.

Each light-emitting device 630 may include a mounting surface 632 (labeled at light-emitting device 630a) that is conductively coupled to the surface 612 of the substrate 610 by a nano-porous metal block 622. Depending on the type of light-emitting device used, the detailed structure of a light-emitting device 630 may vary. For example, FIG. 6A illustrates structure of semi-conductor type light sources such as superluminous diodes or laser diodes. While the light-emitting devices 630 are illustrated as largely rectangular, the light-emitting devices 630 may also take other shapes and may, in some cases, have the structure shown in FIGS. 4D and 4E. In other embodiments, the light-emitting devices 630 have structure that are different from the embodiments shown in FIGS. 4D and 4E.

A light-emitting device 630 may include an N-electrode 634, an N-side substrate 636, an active region 638, a waveguide ridge 640, and a P-electrode 642 (all labeled at the light-emitting device 630a). The mounting surface 632 is the surface that is coupled to the interconnect layer 620 and may vary depending on the orientation of the light-emitting device 630. For example, in the orientation shown in FIG. 6A, the mounting surface 632 is a part of the N-electrode 634. As such, the arrangement of the light-emitting assembly 600 shown in FIG. 6A can be referred to as an N-side mount arrangement. In other embodiments described below, for example, as associated with FIGS. 6B-8B, the mounting surface of a light-emitting device 630 can be one or more other surfaces.

Figure 6B:
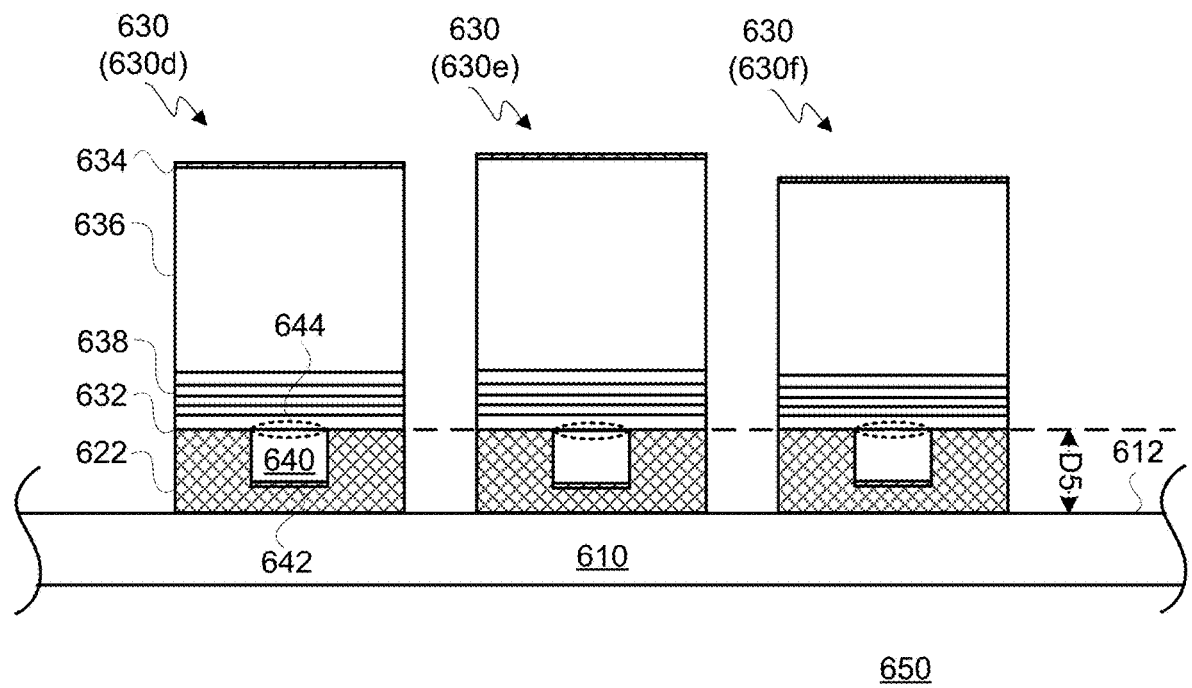
FIG. 6B is a cross sectional diagram illustrating a configuration of a light-emitting assembly having P-electrodes of light-emitting devices mounted onto a substrate, in accordance with an embodiment.

The N-electrode 634 and the P-electrode 642 may be on the opposite sides of a light-emitting device 630. In one embodiment, the N-electrode 634 is an exposed surface of the N-side substrate 636 while the P-electrode 642 is an exposed surface of the waveguide ridge 640. Both N-electrode 634 and P-electrode 642 are connected to externally to a part of an electrical circuit that provides power to the light-emitting device 630. Active region 638 can be quantum wells that generate light. The active region 628 may include an optical output location. Although the embodiments shown in FIGS. 6A and 6B show that the N-electrode 634 and the P-electrode 642 are located on opposites sides, in some embodiments the two electrodes may also be located on the same side.

The waveguide ridge 640 may help control the location, direction, and bandwidth of the light coming out of the light-emitting device 630. The waveguide ridge 640 is connected to and protrudes from a surface of the main body of the light-emitting device 630. The light-emitting device 630 has an optical output location 644, or simply output location, which is the location where light is emitted. The optical output location 644, denoted by a dash-lined ellipse, is normally located at the interface between the waveguide ridge 640 and the body of the light-emitting device 630. However, in some cases, the exact location of the optical output location 644 may vary slightly depending on the structure and materials of the waveguide ridge 640, the active region 638, and the N-side substrate 636. While the optical output locations 644 are shown right at the interface regions for the three light-emitting devices 630a, 630b, and 630c, in various embodiments the optical output locations 644 may slightly deviate from the exact interface region and may location at an inner layer of the active region 638.

The exact locations of the optical output location 644 may vary for additional reasons. As a result, the optical output height of each light-emitting device 630 may be different from each other before the light-emitting devices 630 are mounted on the substrate 610. Before the light-emitting device 410 are mounted on the substrate 610, the optical output height of a light-emitting device 630 may be the distance between the optical output location 644 and the mounting surface 632. For example, a first separating distance D1 in light-emitting device 630a between the optical output location 644 and the mounting surface 632, a second separating distance D2 in light-emitting device 630b, and a third separating distance D3 in light-emitting device 630c are different. The variation in the exact locations of the optical output locations 644 among light-emitting devices 630a, 630b, and 630c may be attributed to the differences in designs, structure, and materials of the light-emitting devices. For example, in the case of semiconductor light sources such as superluminescent diodes, the light-emitting devices 630a, 630b, and 630c may respectively be a red light source, a green light source, and a blue light source. The N-side substrate 636 of a red SLED may be formed from Gallium Arsenide (GaAs) while the N-side substrate 636 of a green or blue SLED may be formed from Gallium Nitrate (GaN). Because of the different materials used, the thickness of the N-side substrates of red SLEDs, green SLEDs, and blue SLED may differ. Also, the optical output location 644 may sometimes also slightly deviate from the interface between the waveguide ridge 640 and the body of the light-emitting device 630.

Since light-emitting assembly 600 may be used as a source array 340 that produces beams of light that are reflected by the scanning mirror 520 and projected on the output waveguide 320, the optical output heights of the light-emitting devices 630 relative to the substrate 610 should be aligned on the same horizontal level so that parallel beams can be produced by the light-emitting assembly 600 and precisely transmitted to the output waveguide 320. The nano-porous metal blocks 622 are used to adjust the optical output locations 644 of the light-emitting devices 630 so that multiple optical output locations 644 are aligned at a common distance D4 from the surface 612 of the substrate 610. As such, the optical output locations 644 are aligned on a common optical plane. This is achieved by adjusting the degree of compression of each nano-porous metal block 622 so that the optical output height of each light-emitting device 630 is aligned with each other at a horizontal level H, denoted by a dashed line. For example, in FIG. 6A, the nano-porous metal blocks 622 may originally have the same thickness but are compressed by different degrees to align the optical output heights of the light-emitting devices 630.

It may be advantageous to use nano-porous metal blocks 622 in place of or in addition to soldering to electrically couple the mounting surface 632 of a light-emitting device 630 to the surface 612, among others, for the following reasons: First, the thicknesses of the nano-porous metal blocks 622 can be finely adjusted by applying different levels of pressure while it could be difficult to precisely control the height of a solder block. Second, some nano-porous metal blocks 622, such as nano-porous gold, are highly malleable so that the metal block can be compressed without splashing or spreading in an uncontrolled manner. Compressing solder may cause the solder to spread to nearby solder locations of other light-emitting devices, which could lead to shorting, undesirable cross linking, and/or occlusion of the output waveguide. This allows closer packing of the light emitting devices 630 relative to each other on the substrate 610. Third, using nano-porous metal blocks 622 often allow bonding at a lower temperature than soldering. For example, a bonding between nano-porous gold and the light-emitting devices 630 may occur at 150 degrees Celsius while soldering normally occurs at 280-320 degrees Celsius. Fourth, the use of nano porous metal blocks allows an active optical alignment process during which the light-emitting devices are powered and are emitting light. Through this process, the optical output locations of the light-emitting devices can be directly aligned when the light-emitting devices are active. In some cases, no prior knowledge of the measurement of the light-emitting devices or the precise locations of the optical output locations are needed.

FIG. 6B is a cross sectional diagram illustrating a configuration of light-emitting assembly 650 that includes P-electrodes of light-emitting devices 630 mounted on a substrate 610, in accordance with an embodiment. In this P-side mount arrangement of light-emitting assembly 650, the P-electrodes 642 and the waveguide ridges 640 are coupled to the nano-porous metal blocks 622 while the N-electrodes 634 are at the top and away from the surface 612 of the substrate 610. The optical output locations 644 among the light-emitting devices 630d, 630e, and 630f are aligned at the same horizontal level that is at a common distance D5 from the surface 612 of the substrate 610 so that the optical outputs from a common optical plane.

This P-side mount arrangement shown in FIG. 6B in some cases may provide advantages over the N-side mount arrangement shown in FIG. 6A. For example, in the case of superluminescent diodes that use Gallium Arsenide or Gallium Nitrate as the substrate, the P-side mount arrangement may provide improved thermal conductivity performance and wall-plug efficiency. In one case when a red superluminescent diode is formed from Gallium Arsenide, the wall-plug efficiency of the P-side mount arrangement increases by 50-100% compared to the N-side mount arrangement. In addition, the P-side mount arrangement may provide a shorter thermal path to the high thermal conductivity substrate 610 because the active regions 638 are often located closer to the P-electrode than the N-electrode. The use of nano-porous metal blocks 622 to couple a light-emitting device 630 and a substrate 610 allows the possibility of a P-side mount arrangement because the nano-porous metal blocks 622 can be compressed in a much more controlled manner than soldering. Hence, the key optical output location associated with the waveguide ridge 640 is not obstructed by a compressed nano-porous metal block 622.

Figure 7:
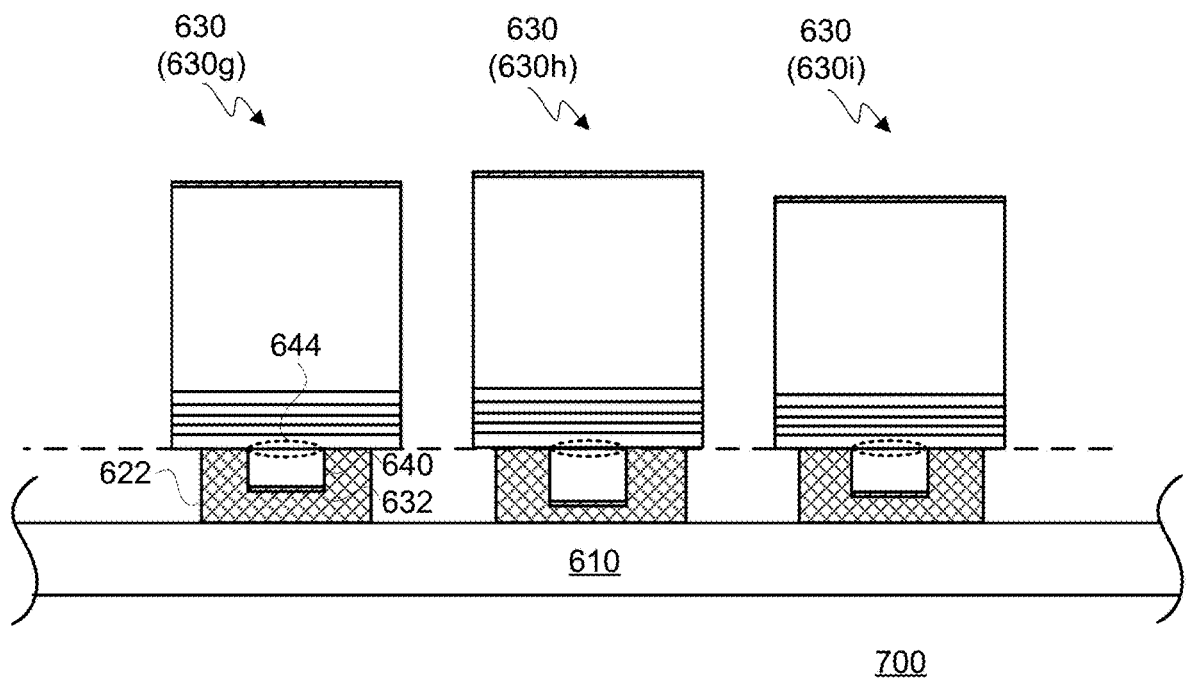
FIG. 7 is a cross sectional diagram illustrating a configuration of a light-emitting assembly that couples nano-porous metal blocks with P-electrodes of light-emitting devices, in accordance with an embodiment.

FIG. 7 is a cross sectional diagram illustrating a configuration of a light-emitting assembly 300 that include coupling light-emitting devices 630 to the substrate 610 by having nano-porous metal blocks 622 coupled with waveguide ridges 640, in accordance with an embodiment. FIG. 7 shows another P-side mount arrangement. Compared to the P-side mount arrangement of the light-emitting assembly 650 shown in FIG. 6B, the light-emitting assembly 700 has nano-porous metal blocks 622 coupled to the waveguide ridge 640. Hence, the mounting surface 632 in this embodiment may be a surface of the waveguide ridge 640 and may be a part of a P-electrode of the light-emitting device 630. To align the optical output locations 644 of different light-emitting devices 630g, 630h, and 630i, different pressure is applied to compress different nano-porous metal blocks 622. The use of nano-porous metal blocks 622 in place of soldering here is advantageous because soldering may spread in an uncontrolled manner when compressed. The spread of soldering may unintentionally occlude some part of a waveguide ridge 640. The nano-porous metal blocks 622 normally does not normally squish around the waveguide ridges 640.

Figure 8:
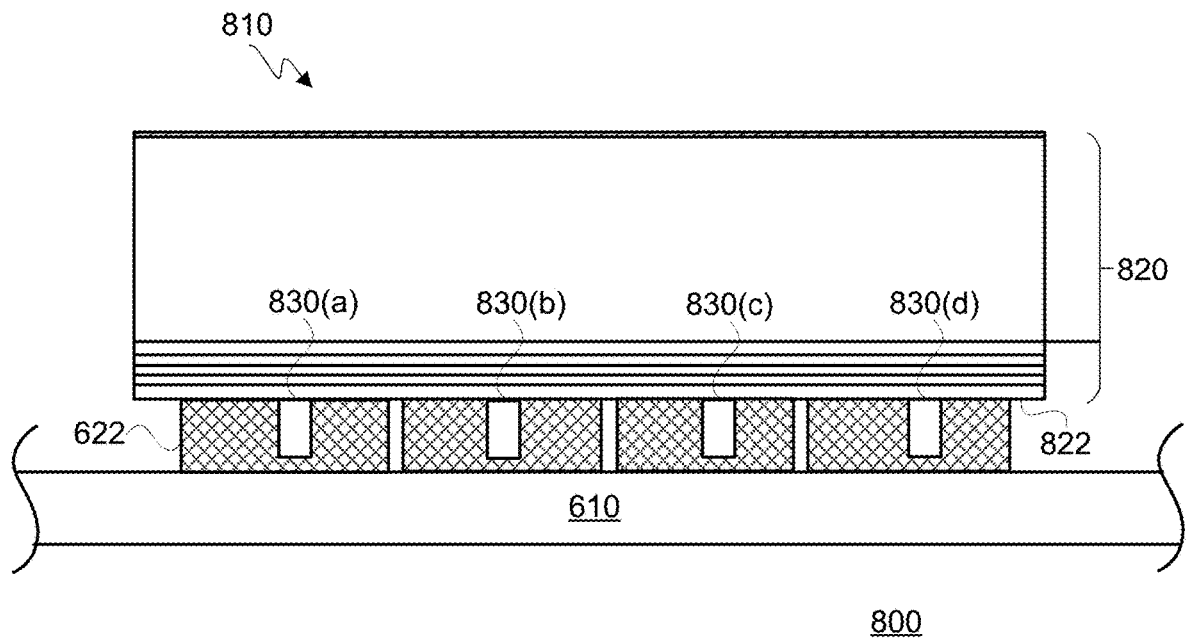
FIG. 8 is a cross-sectional diagram illustrating a configuration of a light-emitting assembly having a light-emitting device that includes multiple waveguide ridges coupled to a substrate, in accordance with an embodiment.

FIG. 8 is a cross sectional diagram illustrating a configuration of a light-emitting assembly 800 that includes a light-emitting device 810 having multiple waveguide ridges 830a through 830d (collectively referred to waveguide ridges 830) coupled to a substrate 610, in accordance with an embodiment. The light-emitting assembly 800 includes the light-emitting device 810 that is electrically coupled to the substrate 610 using multiple nano-porous metal blocks 622. The light-emitting device 810 includes a body 820 and multiple waveguide ridges 830. The waveguides may be used to produce light from discrete quantum wells. The waveguide ridges 830 are attached to and protrude from a surface 822 of the body 820. The light-emitting assembly 800 is in a P-side mount arrangement that includes multiple nano-porous metal blocks 622 coupled to the waveguide ridges 830. In one case, the nano-porous metal blocks 622 are bonded to the surface 822 and may partially cover and surround the waveguide ridges 830, as shown in FIG. 8. In another case, the nano-porous metal blocks 622 are coupled to the light-emitting device 810 only at lower surfaces of the waveguide ridges 830. In yet another case, the nano-porous metal blocks 622 are coupled to the light-emitting device 810 at the surface 822 on each side of the waveguide ridges 830.

In one embodiment, waveguide ridges 830a through 830d are electrically isolated. The nano-porous metal blocks 622 allows individual waveguide ridges 830a through 830d to be connected to different drive signals because the nano-porous metal blocks 622 does not normally laterally spread or does not spread uncontrollably to adjacent ridges. Hence, drive signals of different voltages and/or currents may be applied to different waveguide ridges 830a through 830d.

Similar to other configurations, such use of nano-porous metal blocks 622 in the setting shown in FIG. 8 may provide advantages over soldering for multiple reasons. First, the multiple nano-porous metal blocks 622 can be formed before the light-emitting device 810 is positioned. As such, the light-emitting device 810 can be attached to the substrate 610 through a single bonding (and sometimes also alignment) process that compresses the multiple nano-porous metal blocks 622 simultaneously. Second, the use of nano-porous metal blocks 622 can prevent any unintentionally cross link of the waveguide ridges 830 because materials such as nano-porous gold are malleable. When soldering is used, the solder ball associated with one waveguide ridge 830 may spread to another waveguide ridge 830 and cause an unintentional cross linking of the waveguide ridges.

Figure 9A:
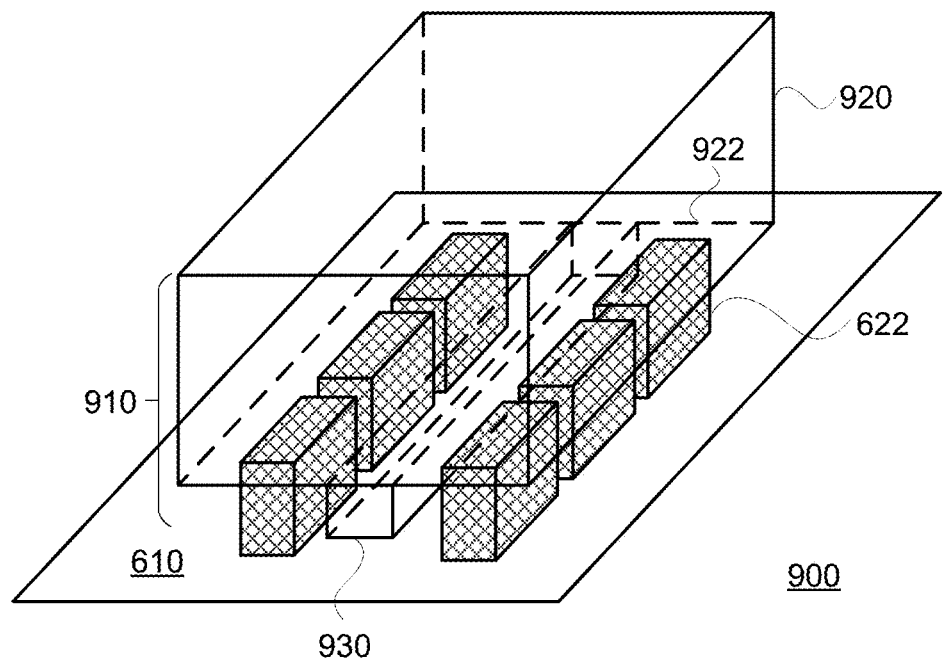
FIG. 9A is a perspective view of a light-emitting device with a straight ridge connected to a substrate, in accordance with an embodiment.

FIG. 9A is a perspective view of a light-emitting device 910 with a straight waveguide ridge 930, in accordance with an embodiment. A light-emitting assembly 900 includes the light-emitting device 910 that is electrically coupled to the substrate 610 via multiple nano-porous metal blocks 622. The light-emitting device 910 includes a body 920 and the straight waveguide ridge 930 protruding from a lower surface 922 of the body 920. The light-emitting assembly 900 is in a P-side arrangement that includes multiple nano-porous blocks 622 coupled to the surface 922 of the body 920. The nano-porous metal blocks 622 may include two series of metal blocks with each series located along a side of the waveguide ridge 930. The use of multiple nano-porous metal blocks 622 coupled to the surface 922 may provide advantages over coupling a single nano-porous metal block 622 the lower surface of the waveguide ridge 930. The multiple nano-porous metal blocks 622 may provide stronger and more balanced bonding and multiple thermal paths between the substrate 610 and the light-emitting device 910. Also, the attachment at the surface 922 on each side of the waveguide ridge 930 reduce the chance of any metal blocks obstructing part of the waveguide ridge 930 that may serve as an optical output location or at which the optical output location may be located.

Figure 9B:
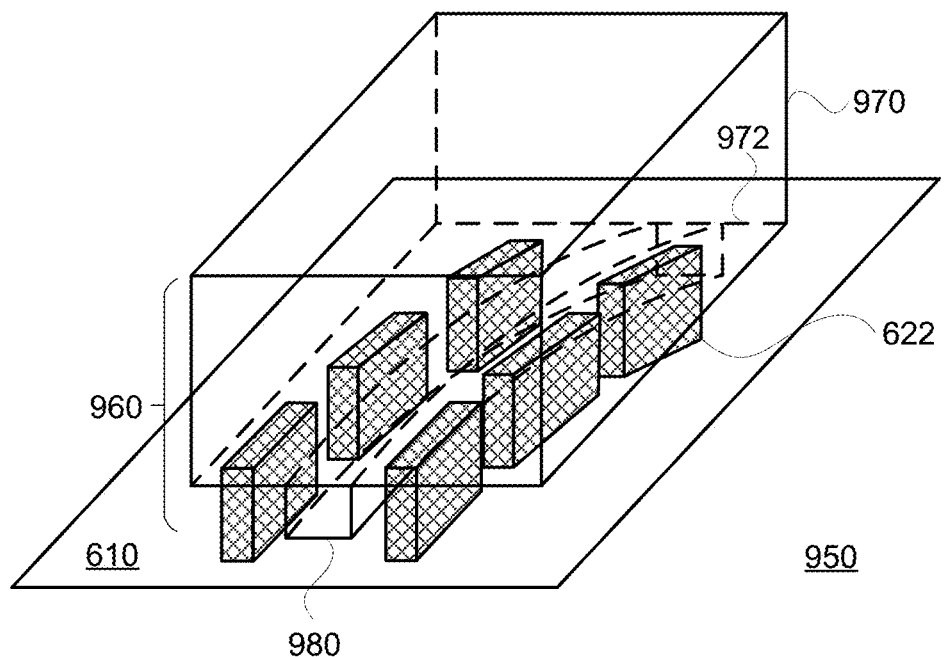
FIG. 9B is a perspective view of a light-emitting device with a curved ridge connected to a substrate, in accordance with an embodiment.

FIG. 9B is a perspective view of a light-emitting device 960 with a curved waveguide ridge 980, in accordance with an embodiment. A light-emitting assembly 950 includes the light-emitting device 960 is electrically coupled to the substrate 610 using multiple nano-porous metal blocks 622. The light-emitting device 960 includes a body 970 and the curved waveguide ridge 980 protruding from a lower surface 972 of the body 970. The curved waveguide ridge 980 may be used to limit the bandwidth of light emitted from the light-emitting device 960. For example, the curved waveguide ridge 980 is designed to allow light within a desired bandwidth to propagate along the curved waveguide ridge 980 by total internal reflection and be emitted at the intended optical output location, while light with other bandwidth may exit prematurely in other locations. The nano-porous metal blocks 622 may include two series of metal blocks with each series located along a side of the curved waveguide ridge 980. Each series may be placed in a curved line or a straight line. The use of multiple nano-porous metal blocks 622 provide stronger structural support to the light-emitting device 960 and also allows simultaneous bonding between the nano-porous metal blocks 622 and the light-emitting device 960 in one sitting.

While a single light-emitting device is shown in each of the FIGS. 8, 9A, and 9B, it should be understood that the substrate 610 in those figures, like other embodiments described herein, can be coupled to multiple light-emitting devices.

Figure 10:
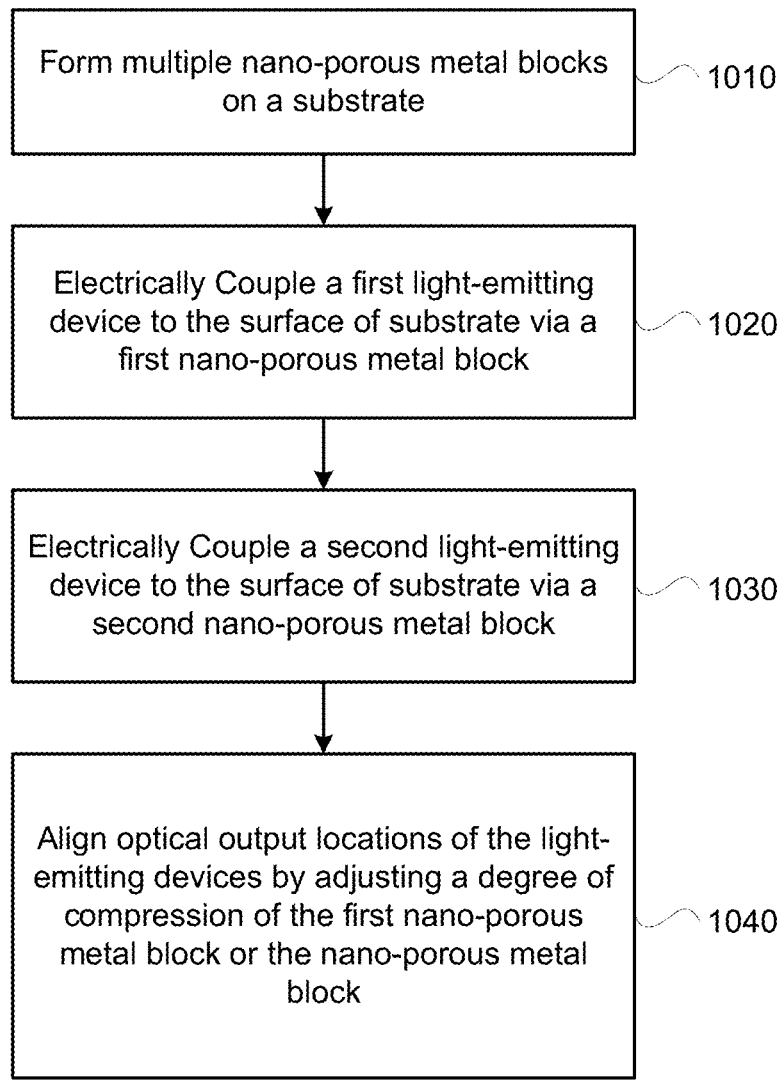
FIG. 10 is a flowchart depicting a process of making a light-emitting device, in accordance with an embodiment.

FIG. 10 is a flowchart illustrating a process of coupling light-emitting devices, in accordance with some embodiment. The process may begin with a substrate. Multiple nano-porous metal blocks may be formed 1010 on a surface of a substrate. The formation of the nano-porous metal blocks may include a plating process followed by selective dissolution. For example, when nano-porous gold is used, the formation process may start with a gold alloy that includes the gold constituent and a chemically-dissolvable constituent such as silver. Other chemically-dissolvable constituents such as zinc, nickel, aluminum, platinum, and/or any combination thereof may also be possible. The alloy is deposed onto the substrate with or without a seed layer through a plating process such as sputtering, evaporating, electroplating, deposition, and the like.

After the alloy is formed on the substrate, a dissolving agent such as nitric acid is used to dissolve and remove the silver in the alloy. The pore size of the nano-porous gold may be adjusted by using different dissolving agent and conditions such as acidity, temperature, and applied potential. The multiple nano-porous metal blocks may be formed individually by use of a seed layer that has individual seed blocks. Alternatively, a single continuous nano-porous metal layer may be formed first, then individual metal blocks are formed by ablating and removing the nano-porous material at the boundaries of the metal blocks.

A first light-emitting device may be electrically coupled 1020 to the substrate via a first nano-porous metal block. The first light-emitting device includes a first mounting surface that is electrically coupled to the surface of the substrate via the first nano-porous metal block. A pick and place robotic arm may be utilized to position and align the first light-emitting device to the first nano-porous metal block.

A preliminary pressure may be applied to mechanically bond the first light-emitting device to the nano-porous metal block. A second light-emitting device may be electrically coupled 1030 to the substrate via the second nano-porous metal block. The second light-emitting device includes a second mounting surface that is electrically coupled to the surface of the substrate via the second nano-porous metal block. The process described in steps 1020 and 1030 may be repeated for additional light-emitting devices. The electrical coupling of the first light-emitting device to the substrate and the electrical coupling of the second light-emitting device to the substrate may occur sequentially or simultaneously.

Optical output locations of the multiple light-emitting devices coupled to the substrate may be aligned 1040 by adjusting the degree of compression of the nano-porous metal blocks. After the light-emitting devices are coupled to a substrate, the optical heights of each light-emitting device can be different due to various reasons previously discussed. For each individual light-emitting device, the optical height relative to the surface of the substrate is adjusted to a target level that aligns the optical output locations of the light-emitting devices. The alignment can be achieved by applying different pressure to different nano-porous metal blocks to adjust the degree of compression of each nano-porous metal block. In one embodiment, pressure is applied at either 150 degrees Celsius or a slightly higher temperature. Application of a higher temperature allows for a lower compression force, which may be required in some situations to avoid damaging the light-emitting devices. The alignment may be applied to some or all of the light-emitting devices.

For example, the optical output location of the first light-emitting device and the optical output location of the second light-emitting device can be aligned by adjusting a degree of compression of the first nano-porous metal block or the second nano-porous metal block. Put differently, before the alignment, the nano-porous metal blocks may have the same thickness. By applying different degrees of compression, the first nano-porous metal block may have a different thickness than the second nano-porous metal block.

In positioning and aligning a light-emitting device, two rounds of pressure can be applied to the nano-porous metal blocks. A first round of pressure can be applied to induce bonding between the nano-porous metal block and the light-emitting device. A second round of pressure can be applied to align the optical heights of the light-emitting devices to a target level.

In some embodiments, the alignment of the optical output locations of the light-emitting devices relative to the surface of the substrate may be carried out during which the light-emitting devices are connected to a power source and are active. The use of an active optical alignment allows a manufacturing system to detect the light emitted to determine the actual optical output locations of the light-emitting devices. Pressure can be applied to an individual light-emitting device to align the optical output locations based on the light detected. Using an active optical alignment method, the optical height or the size dimension of each light-emitting device does not need to be predetermined.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A light-emitting assembly, comprising:
    a substrate having a surface;
    a first light-emitting device comprising a first mounting surface conductively coupled to the surface of the substrate via a first nano-porous metal block, a first optical output location of the first light-emitting device separated by a distance from the surface of the substrate, wherein the first mounting surface comprises a plurality of waveguide ridges attached to the surface of the substrate by a first set of nano-porous metal blocks, the first set including the first nano-porous metal block; and
    a second light-emitting device comprising a second mounting surface conductively coupled to the surface of the substrate via a second nano-porous metal block, a second optical output location of the second light-emitting device separated by the distance from the surface of the substrate.

2. The light-emitting assembly of claim 1, wherein the first and second light-emitting devices are superluminescent diodes.

3. The light-emitting assembly of claim 1, wherein each of the first and second nano-porous metal blocks comprises nano-porous gold.

4. The light-emitting assembly of claim 1, wherein the first mounting surface is a part of P-electrode of the first light-emitting device and the second mounting surface is a part of P-electrode of the second light-emitting device.

5. The light-emitting assembly of claim 1, wherein at least a first waveguide ridge of the plurality of waveguide ridges is configured to be driven by a first drive signal and a second waveguide ridge of the plurality of waveguide ridges is configured to be driven by a second drive signal different from the first drive signal.

6. The light-emitting assembly of claim 1, wherein the first mounting surface is attached with a curved waveguide ridge, the first mounting surface conductively coupled to a series of nano-porous metal blocks at a side of the curved waveguide ridge positioned along the curved waveguide ridge, the series of the nano-porous metal blocks including the first nano-porous metal block.

7. The light-emitting assembly of claim 1, wherein the first optical output location is separated from the first mounting surface by a first separating distance, and wherein the second optical output location is separate from the second mounting surface by a second separating distance different from the first separating distance.

8. The light emitting assembly of claim 1, wherein the first nano-porous metal block has a first thickness and the second nano-porous metal block has a second thickness different from the first thickness.

9. The light emitting assembly of claim 1, wherein the first light-emitting device comprising a first body and a first waveguide ridge and the second light-emitting device comprising a second body and a second waveguide ridge, wherein the first optical output location of the first light-emitting device is located at a first interface between the first body and the first waveguide ridge, and wherein the second optical output location of the second light-emitting device is located at a second interface between the second body and the second waveguide ridge.

10. A light-emitting assembly, comprising:
    a substrate having a surface;
    a first light-emitting device comprising a first mounting surface conductively coupled to the surface of the substrate via a first nano-porous metal block, a first optical output location of the first light-emitting device separated by a distance from the surface of the substrate, wherein the first mounting surface is attached with a curved waveguide ridge, the first mounting surface conductively coupled to a series of nano-porous metal blocks at a side of the curved waveguide ridge positioned along the curved waveguide ridge, the series of the nano-porous metal blocks including the first nano-porous metal block; and
    a second light-emitting device comprising a second mounting surface conductively coupled to the surface of the substrate via a second nano-porous metal block, a second optical output location of the second light-emitting device separated by the distance from the surface of the substrate.

11. The light-emitting assembly of claim 10, wherein each of the first and second nano-porous metal blocks comprises nano-porous gold.

12. The light-emitting assembly of claim 10, wherein the first mounting surface is a part of P-electrode of the first light-emitting device and the second mounting surface is a part of P-electrode of the second light-emitting device.

13. The light-emitting assembly of claim 10, wherein the first optical output location is separated from the first mounting surface by a first separating distance, and wherein the second optical output location is separate from the second mounting surface by a second separating distance different from the first separating distance.

14. The light emitting assembly of claim 10, wherein the first nano-porous metal block has a first thickness and the second nano-porous metal block has a second thickness different from the first thickness.

15. The light emitting assembly of claim 10, wherein the first light-emitting device comprising a first body and a first waveguide ridge and the second light-emitting device comprising a second body and a second waveguide ridge, wherein the first optical output location of the first light-emitting device is located at a first interface between the first body and the first waveguide ridge, and wherein the second optical output location of the second light-emitting device is located at a second interface between the second body and the second waveguide ridge.

16. A light-emitting assembly, comprising:
   a substrate having a surface;
   a first light-emitting device comprising a first mounting surface conductively coupled to the surface of the substrate via a first nano-porous metal block, a first optical output location of the first light-emitting device separated by a distance from the surface of the substrate; and
   a second light-emitting device comprising a second mounting surface conductively coupled to the surface of the substrate via a second nano-porous metal block, a second optical output location of the second light-emitting device separated by the distance from the surface of the substrate, wherein the first light-emitting device comprising a first body and a first waveguide ridge and the second light-emitting device comprising a second body and a second waveguide ridge, wherein the first optical output location of the first light-emitting device is located at a first interface between the first body and the first waveguide ridge, and wherein the second optical output location of the second light-emitting device is located at a second interface between the second body and the second waveguide ridge.

17. The light-emitting assembly of claim 16, wherein each of the first and second nano-porous metal blocks comprises nano-porous gold.

18. The light-emitting assembly of claim 16, wherein the first mounting surface is a part of P-electrode of the first light-emitting device and the second mounting surface is a part of P-electrode of the second light-emitting device.

19. The light-emitting assembly of claim 16, wherein the first optical output location is separated from the first mounting surface by a first separating distance, and wherein the second optical output location is separate from the second mounting surface by a second separating distance different from the first separating distance.

20. The light emitting assembly of claim 16, wherein the first nano-porous metal block has a first thickness and the second nano-porous metal block has a second thickness different from the first thickness.

* * * * *